United States Patent [19]
Fujii et al.

[11] Patent Number: 5,319,607
[45] Date of Patent: Jun. 7, 1994

[54] SEMICONDUCTOR UNIT

[75] Inventors: Yasuhiro Fujii; Hirohiko Mochizuki; Yukinori Kodama, all of Kawasaki; Akira Sugiura, Kasugai, all of Japan

[73] Assignees: Fujitsu Limited, Kanagawa; Fujitsu VLSI Limited, Aichi, both of Japan

[21] Appl. No.: 793,970

[22] Filed: Nov. 18, 1991

[30] Foreign Application Priority Data

Nov. 16, 1990 [JP] Japan .................................. 2-310222

[51] Int. Cl.⁵ ........................................ G11C 13/00
[52] U.S. Cl. .................................. 365/233.5; 365/194; 307/594; 307/597
[58] Field of Search ..................... 365/233.5, 194; 307/443, 481, 594, 597

[56] References Cited

U.S. PATENT DOCUMENTS

| | | | |
|---|---|---|---|
| 4,922,461 | 5/1990 | Hayakawa et al. | 365/233.5 X |
| 4,926,379 | 5/1990 | Yoshida | 365/233.5 X |
| 4,985,646 | 1/1991 | Kumagai et al. | 307/594 X |
| 5,068,553 | 11/1991 | Love | 307/594 X |

OTHER PUBLICATIONS

IEEE 1990 Symposium on VLSI Circuits, Jun. 9, 1990, Honolulu, USA, pp. 53–54; Sekiyama et al: "A IV Operating 256KBIT Full CMOS SRAM".

Patent Abstracts of Japan, vol. 11, No. 2 (P-532) Jan. 6, 1987 & JP-A-61 180 990.

*Primary Examiner*—Eugene R. LaRoche
*Assistant Examiner*—Do Hyun Yoo
*Attorney, Agent, or Firm*—Nakaido, Marmelstein, Murray & Oram

[57] ABSTRACT

The present invention relates to a semiconductor unit including a delay circuit used for an address transition detecting circuit in a storage, wherein a change of an address is detected and, accordingly, an access address in a memory cell is altered. The present invention aims at ensuring extending an address signal even though that of a short pulse width is provided, and at outputting an address transition detection signal of a predetermined pulse width, thereby stabilizing the operation of the circuit and improving its reliability. The present invention includes a second address extending circuit having a complementary transistor circuit, a capacitor connected to the output part of the complementary transistor circuit, and a resistor serially connected between a pair of complementary transistors. A signal generating circuit for outputs an address transition detection signal in response to a non-inverted address signal, an inverted address signal, and output of the first and the second address extending circuits.

10 Claims, 19 Drawing Sheets

BSR : BUS RESET SIGNAL
SBE : BUS ACTIVATING SIGNAL
ATDD : ADDRESS TRANSITION DETECTION DATA

Fig.17A
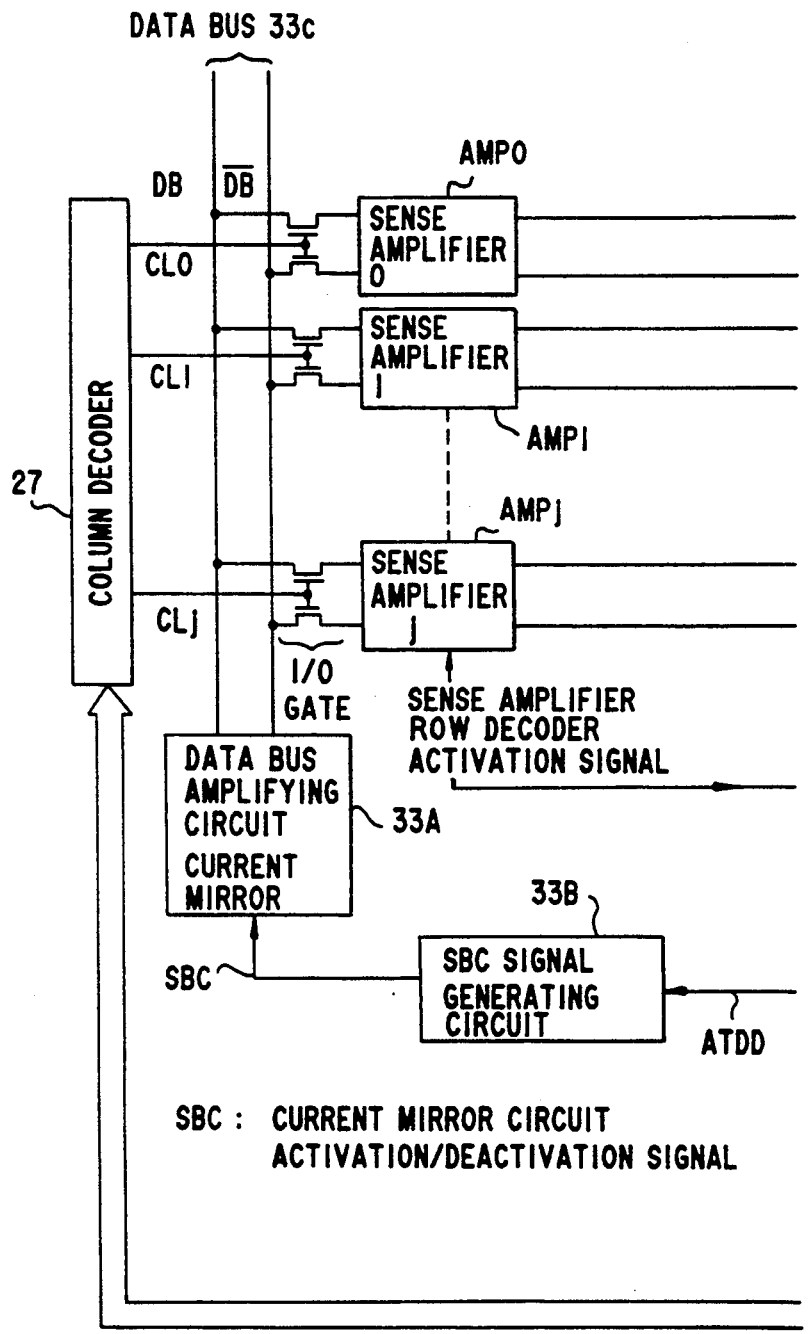
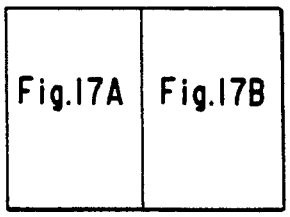
Fig.17

SEMICONDUCTOR UNIT

FIELD OF THE INVENTION

The present invention relates to a delay circuit in a semiconductor circuit or a semiconductor integrated circuit, and specifically to a semiconductor unit forming a delay circuit used for an address transition detecting circuit of a storage which detects changes in an address signal which alter an access address in a memory cell.

BACKGROUND OF THE INVENTION

Recently, random access memories (hereinafter referred to as a RAMS) have become widely used for storing information in main memories and cache memories of various computers.

Generally, a RAM comprises memory cells; an address decoder having a column decoder and a row decoder for operating the memory cells selectively; an address transition detecting circuit for detecting a change of an address; and a data output circuit for altering an access address of a memory cell according to a detection result provided by the address transition detecting circuit.

The above described address transition detecting circuit cooperates with the address decoder to ensure that it does not fail to detect a change of an address. FIG. 1 shows a configuration of a RAM comprising a conventional address transition detecting circuit; FIGS. 2 and 3 show an operational time chart of an address transition detecting circuit.

In FIG. 1, a RAM for detecting a change in an address signal for altering an access address in a memory cell comprises a plurality of memory cells 1, an address decoder having a column decoder 2 and a row decoder 4, an address transition detecting circuit 5, an address buffer 6, a data output circuit 8 having a sense amplifier 3, and a data bus buffer 7.

The address transition detecting circuit 5 detects the change in an address signal Ai (i=0, 1, 2, 3, —, n) in a plurality of address signals A0—An used for designating an information storage address in a memory cell 1. It comprises a first address extending circuit 5A, a second address extended circuit 5B, and an address transition detection (hereinafter referred to as an ATD) pulse, generator 5C. The address transition detecting circuit 5 is provided for the number of bits forming an input address signal.

The first address extending circuit 5A comprises:
  a CMOS inverter comprising inverters IN1 and IN2 and IN3 and IN4 each provided at an input step and an output step, a p-channel type field effect transistor TP1 (hereinafter referred to as a transistor TPi), and an n-channel type field effect transistor Tn1 (hereinafter referred to as a transistor Tni) each provided at the intermediate step;
  a CMOS inverter comprising a transistor TP2 and a transistor Tn2; and
  a delay circuit comprising a resistor R1 and a capacitor C1 each provided between the CMOS inverters, and a resistor R2 and a capacitor C2 each provided between the latter CMOS inverter and an inverter IN3 at the output step.

The second address extending circuit 5B comprises:
  a CMOS inverter comprising inverters IN5-IN7 and IN8 and IN9 each provided at an input step and an output step, transistors TP3 and Tn3 each provided at the intermediate step;
  a CMOS inverter comprising a transistor TP4 and a transistor Tn4; and
  a delay circuit comprising a resistor R3 and a capacitor C3 each provided in the CMOS inverter, and a resistor R4 and a capacitor C4 each provided between the latter CMOS inverter and an inverter IN8 at the output step.

Drains of transistors TP1, TP2, TP3, and TP4 forming the CMOS inverters are connected to the power source; the sources of transistors Tn1, Tn2, Tn3, and Tn4 are grounded; and the sources of the transistors TP1, TP2, TP3, and TP4 and the drains of the transistors Tn1, Tn2, Tn3, and Tn4 are connected and used as the output of the CMOS inverter. Furthermore, the gates of the transistors TP1, TP2, TP3, and TP4 and the gates of the transistors Tn1, Tn2, Tn3, and Tn4 are connected and used as the input.

Each of the resistors R1–R4 is connected between the output part of each CMOS inverter and the input part of each CMOS inverter, etc. at the following step. The capacitors C1–C4 are connected to the output side of the resistors R1–R4. The delay circuit optionally delays an address signal Ai using a time constant of a resistor Rj (j=1, 2, —) and a capacitor Cj.

FIG. 2 shows a non-inverted address signal A and variations of signal waves of nodes (output points) n1–n4 of the first address extending circuit 5A.

If, in FIG. 2, a non-inverted address signal A, that is of one address signal Ai of a plurality of address signals A0-An used for designating an information storage unit in a memory cell 1 is applied to the first address extending circuit 5A, a delay process is performed by each of the inverters IN1 and IN2, two CMOS inverters, a delay circuit comprising resistors R1 and R2 and capacitors C1 and C2, and the inverters IN3 and IN4. An address change signal is then output by the inverter IN4 to the ATD pulse generator 5C. An AL1 is an address change lost portion where an address change signal is lost because a short pulse address signal is applied to the inverter IN1. The short pulse address signal is generated irregularly by a malfunction of a circuit or an irregular process.

FIG. 3 shows an inverted address signal $\overline{A}$ and variations of signal waves associated with nodes n5–n8 of the second address extending circuit 5B and an ATD signal.

If, in FIG. 3, a non-inverted address signal A is inverted by the inverter IN5 and applied to the second address extending circuit 5B, a delay process is performed by inverters IN6 and IN7, the delay circuit comprising resistors R3 and R4 and capacitors C3 and C4, and inverters IN8 and IN9. An address change signal is then output by the inverter IN9 to the ATD pulse generator 5C. An AL2 is an address change lost portion.

Ideally, a signal indicated by a broken line as shown by a line of an ATDi signal in FIG. 3 is required. However, the delay circuit does not work according to a short time change of a non-inverted address signal and an inverted address signal. Thus an ATDi signal, shown in FIG. 3, is generated without a broken line point.

In general use, a short pulse address change is not generated. Therefore, the ATD pulse generator 5C detects the change of the non-inverted address signal A for altering an access address A in a memory cell In the prior art technology, each of the resistors R1–R4 in the delay circuit is connected between the output and input parts of each CMOS inverter, etc. in the following step, as described above.

Therefore, when a pulse width of an address signal gets too small, the peak of a wave of a signal is ruined, thereby generating an address change lost portions AL1 and AL2. A short address change cannot be sensitively processed because the address signal is delayed in response to the change both from L level to H level and from H level to L level using a time constant associated with each of resistors R1-R4 and capacitor elements C1-C4 in the delay circuit, and the result is output as an address change signal from the inverters IN4 and IN9.

That is, a delay circuit comprising resistors and capacitors is equivalent to a low pass filter, and a short pulse of unexpectedly high frequency components cannot be transmitted.

Additionally, the address change lost portion may be generated when a delay process cannot be performed exactly with the change in transistor characteristics associated with an irregular process of each of resistors R1-R4, inverter IN1 and CMOS inverters.

Therefore, when an extraordinarily short pulse address signal is applied to a RAM, a pulse is not output from the delay circuit in spite of a change in an address signal. Accordingly, the data bus buffer 7 may not work even though a short pulse only is applied, or an access address in a memory cell 1 may not be altered. Furthermore, if the column decoder 2 is operated according to the change in an address signal of a short pulse width, the data bus buffers 7, etc. at the next step in response to an ATD signal of the short pulse width are not operated by the output, so there may be a destruction of data in the memory cell 1. That is, a RAM permits complete data to be stored only when both devices operate perfectly. A more detailed explanation is given as follows for a process using a wave form. FIG. 4 shows a wave form of a BSR signal, an SBE signal, a CL signal, and a DB signal when an address signal changes normally (correctly). Nothing is provided between the above described address transition detection circuit 5 and the data bus buffer 7 to simplify the explanation. Actually, however, the following two circuits are provided: a BSR signal generating circuit for receiving the output ATD from the address transition detection circuit 5 and for controlling the ATD signal by an enable signal from the RAS, and an SBE signal generating circuit for receiving the output and further extending the wave form to apply the result to a data bus buffer. When an address is changed during the normal operation, ATD, BSR, and SBE signals are changed from H level to L level sequentially. As the BSR and SBE signals change, data buses DB and $\overline{DB}$ are changed to H level. Then, decode values CL0 and CL1 are output by a column decoder. For example, if the decode value CL0 is the former address decode value and the value CL1 is an address decode value after an address change, the CL0 is turned from H level to L level, while the CL1 is turned from L level to H level. The ATD, BSR, and SBE signals are changed after these decode values have changed, and then target data DB and $\overline{DB}$ are outputted to a data bus.

On the other hand, as shown in FIG. 5, if an address signal is changed from H level to L level and then immediately returned to H level, the data bus DB is changed to H level and the data bus $\overline{DB}$ is changed to L level and not equalized, although both of them should keep at H level. Therefore, information is sent by the data buses DB and $\overline{DB}$ in the opposite direction of a sense amplifier to which the CL1 is connected, thus destroying the information in the sense amplifier.

As shown in FIG. 6, even when an ATD signal is not output, a decode value CL1 is turned to H level with the data buses DB and $\overline{DB}$ unequalized, thus turning on a transistor which is connected to a bus. Thus, inverse information is sent by data buses DB and $\overline{DB}$. This inverse information is connected to the decode value CL1, thus destroying the information in the sense amplifier.

Summing up, when an address changes for a short time due to a noise, for example, there arises the problem that data can be destroyed.

By contrast, there has been a problem that an address transition detecting process cannot be performed perfectly when irregular processes are generated. That is, poor reliability (sensitivity) of an address transition detecting circuit prevents a high speed write/read of the semiconductor storage.

SUMMARY OF THE INVENTION

The feature of the present invention resides in a semiconductor unit comprising: a first address extending circuit for correcting a non-inverted address signal of one of a plurality of addresses, used for designating an information storage address to be output as a non-inverted corrective address signal; a second address extending circuit for correcting an inverted address signal of the above described one address, to be output as an inverted corrective address signal; and a signal generating circuit for receiving the non-inverted address signal, non-inverted corrective address signal, inverted address signal, and inverted corrective address signal and for outputting an address transition detection signal. Each of the above described first and second address extending circuits comprises: a single- or multiple-step complementary transistor circuit having a p-channel type field effect transistor and an n-type field effect transistor; a capacitor connected to the output part of the complementary transistor circuit; and a resistor serially connected between the p-channel type field effect transistor and the n-channel type field effect transistor. An object of the present invention is to ensure that an address signal is extended even though a signal of a short pulse width is provided, and to output an address transition detection signal of a predetermined pulse width, thereby stabilizing the operation of the circuit and improving its reliability.

BRIEF EXPLANATION OF THE DRAWINGS

FIGS. 17, 17A, and 17B show another configuration of a semiconductor unit of the first embodiment of the present invention.

DESCRIPTION OF THE PREFERRED EMBODIMENT

Figure 7:
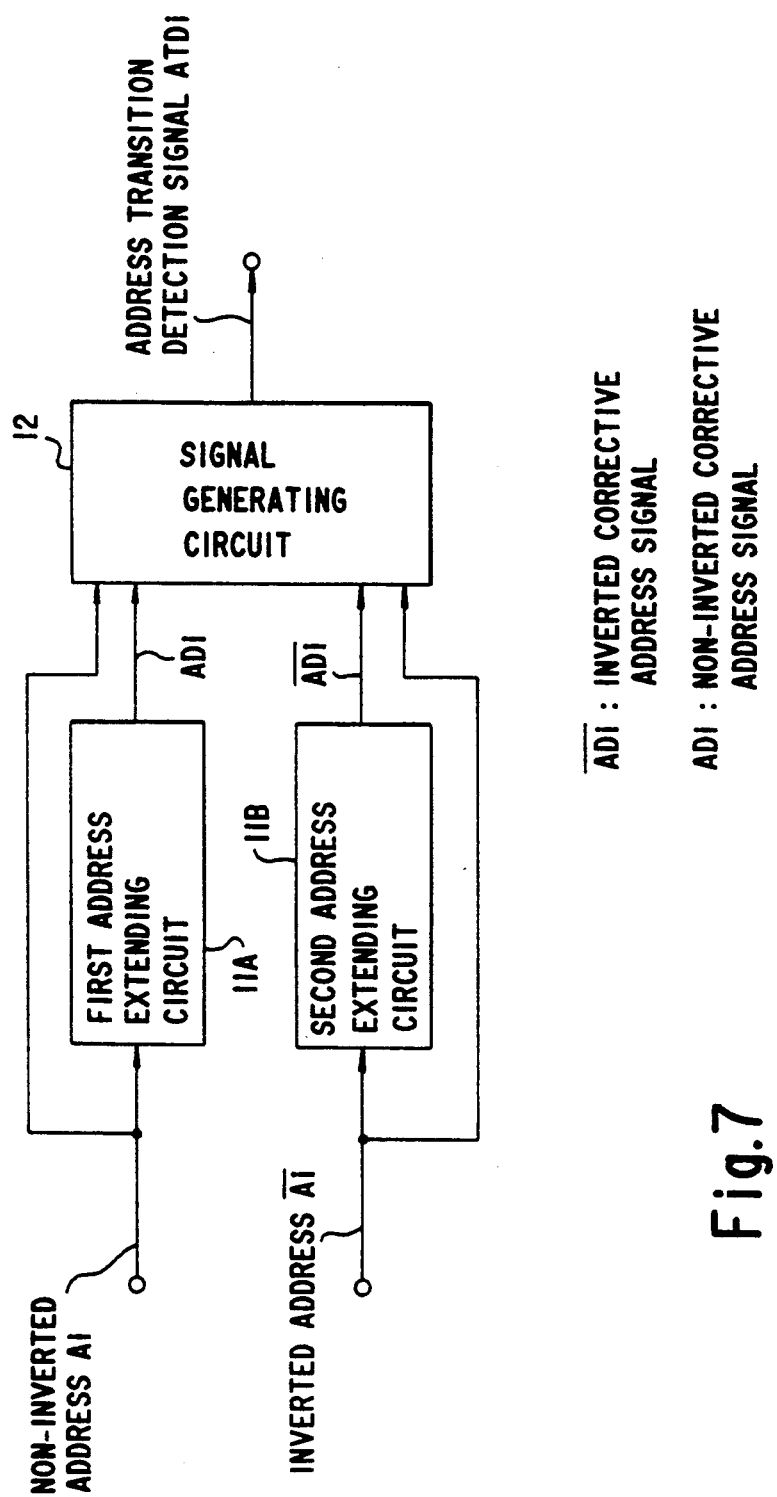
FIG. 7 is a block diagram for explaining the principle of the present invention.

FIG. 7 is a block diagram for explaining principle of a semiconductor unit of the present invention.

The semiconductor integrated circuit of the present invention comprises a first address extending circuit 11A for correcting a non-inverted address signal Ai of one address Ai of a plurality of addresses A0–An used for designating an information storage address as shown in FIG. 7 and then outputting a non-inverted corrective address signal ADi; a second address extending circuit 11B for correcting an inverted address signal $\overline{Ai}$ of the address Ai and then outputting an inverted corrective address signal $\overline{ADi}$ and a signal generating circuit 12 for outputting an address transition detection signal ATDi corresponding to the change of an address in response to the non-inverted address signal Ai, the non-inverted corrective address signal ADi, the inverted address signal $\overline{Ai}$, and the inverted corrective address signal $\overline{ADi}$.

Figure 8:
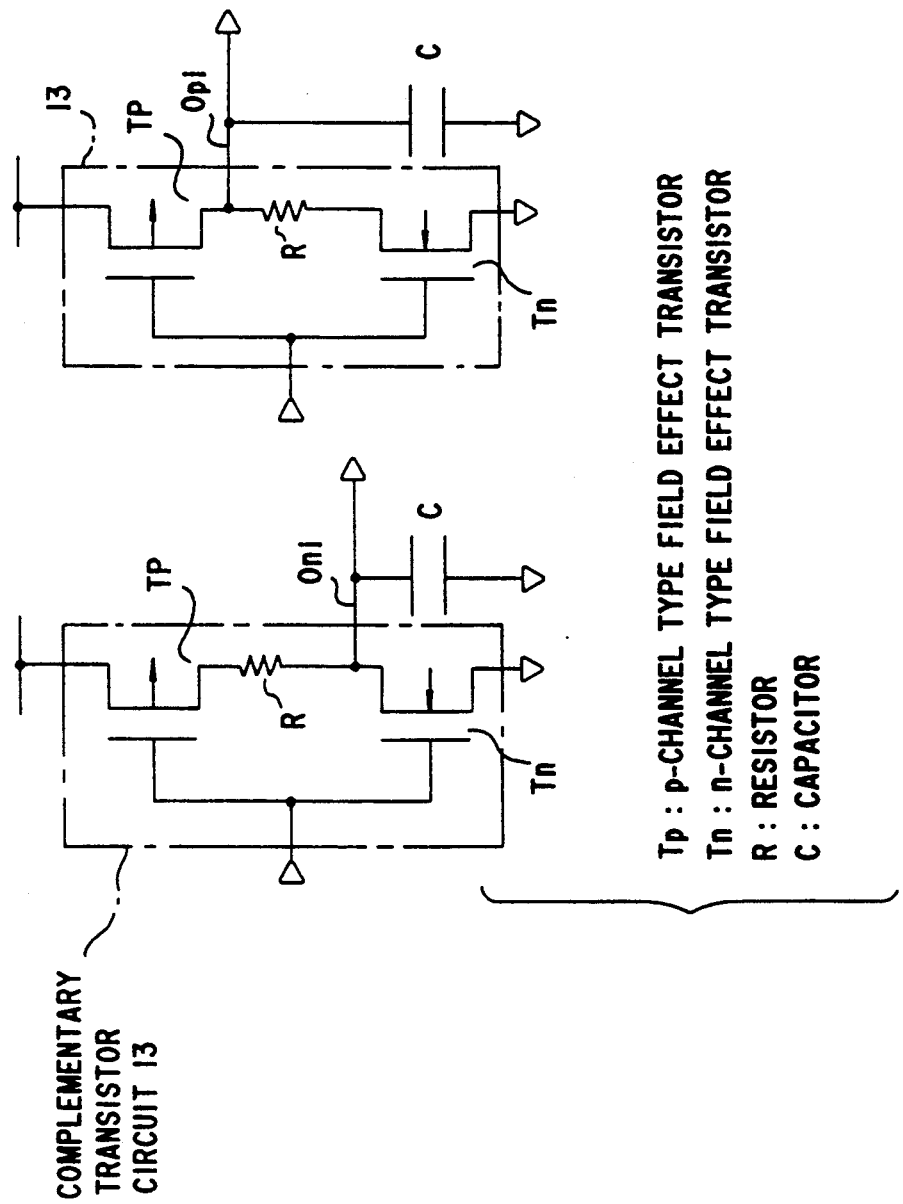
FIG. 8 shows a circuit of an address extending circuit.

The first and second address extending circuits 11A and 11B have the configuration shown in FIGS. 8A and 8B. This configuration comprises one or more than one complementary transistor circuit 13 having a p-channel type field effect transistor Tp and an n-channel type field effect transistor Tn; a capacitor C connected to the output part Opi of the complementary transistor circuit 13; and a resistor R serially connected between the p-channel type field effect transistor Tp and the n-channel type field effect transistor element Tn.

The capacitor C is connected to the output part Opi on the side of the p-channel type field effect transistor Tp of the complementary transistor circuit 13. Otherwise, the capacitor C is connected to the output part Oni on the side of the n-channel type field effect transistor Tn of the complementary transistor circuit 13.

One address signal Ai of a plurality of address signals A0–An used for designating an information storage address is corrected by the first address extending circuit 11A, and its non-inverted corrective address signal ADi is output to the signal generating circuit 12. An inverted address signal $\overline{Ai}$ of one address signal Ai is corrected by the second address extending circuit 11B, and the inverted corrective address signal $\overline{ADi}$ is output to the signal generating circuit 12. The "correction" means holds a specific level at a specific time in the direction of change in response to a change of an address. For example, if a non-inverted address signal Ai is changed either from L level to H level or from H level to L level, that is, the signal is delayed by the complementary transistor circuit 13 in the first and the second address extending circuits 11A and 11B, it is output to the signal generating circuit 12 as an inverted corrective address signal $\overline{ADi}$ or a non-inverted corrective address signal ADi (address change signal).

When an address changes either from L level to H level or from H level to L level, a delay arises through the resistor R and the capacitor C in an output signal of the complementary transistor circuit 13. However, a time constant has no influence on the capacitor C X resistor R in the opposite direction. For example, when data is input from L level to H level, the output is given as inverted without the influence of a resistor; when data is input from H level to L level, the output is given as inverted and is delayed. Then, the input pulse can be delayed by providing a similar delay in the second step.

When a non-inverted address signal Ai, a non-inverted corrective address signal ADi, an inverted address signal $\overline{Ai}$, and an inverted corrective address signal $\overline{ADi}$ are applied to the signal generating circuit 12, an address transition detection signal ATDi is output by the signal generating circuit 12.

If a pulse width of an address signal Ai gets too small for any reason, address change lost portions AL1 and AL2 can be prevented from being generated and from causing the destruction of the peak of a non-inverted corrective address signal ADi and inverted corrective address signal $\overline{ADi}$ as detected in the prior art technology.

Accordingly, even though an address signal Ai with a short pulse width is applied to the address transition detecting circuit 18A, the change can be detected and an address transition detection signal ATDi with a predetermined pulse width can be output to a circuit in the following step such as a data bus buffer, etc., thus ensuring that an access address in a memory cell is altered.

Figure 9:
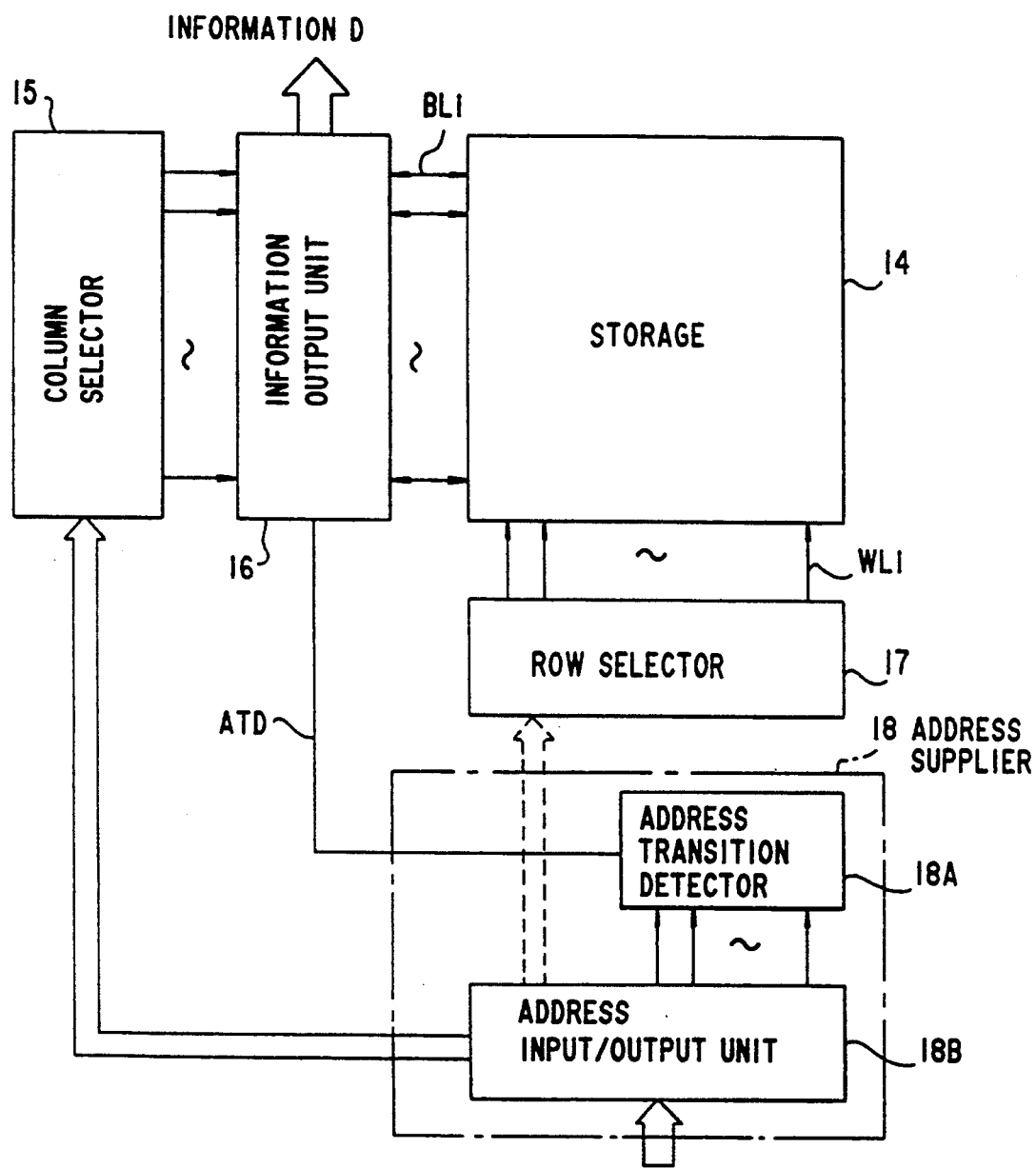
FIG. 9 is a block diagram for explaining the principle of the semiconductor unit of the present invention.

A semiconductor unit of the present invention comprises, as shown in FIG. 9, a storage unit 14 for storing information D, a column selector 15 for selecting a signal line BLi in the column direction of the storage unit 14, an information output unit 16 for controlling write/read of the information D, a row selector 17 for selecting a signal line WLi in the row direction of the storage unit 14, and an address supplier 18 for supplying the column selector 15 and the row selector 17 with addresses A0–An, wherein the address supplier 18 comprises an address transition detector 18A and an address input output unit 18B and the address transition detector 18A comprises the above described semiconductor integrated circuit.

Then, a resistor R of the address transition detector 18A is formed of the same material as that of the gate G of the p-channel type field effect transistor Tp and the n-channel type field effect Tn of the complementary transistor circuit 13.

When the information D is read from the storage unit 14, the address supplier 18 supplies the column selector 15 and the row selector 17 with addresses A0–An. The address transition detector 18A detects the change in each of the address bits. For example, when an address signal Ai with a short pulse width is applied, the change is detected by the address transition detector 18A, and an address transition detection signal with a predetermined pulse width is output to the information output unit 16, such as a data bus buffer, etc. Concurrently, a signal line BLi in the column direction of the storage unit 14 is selected by the column selector 15; a signal line WLi in the row direction of the storage unit 14 is selected by the row sector 17; and the read of the information D is controlled by the information output unit 16 according to an address transition detection signal ATD.

Therefore, even when an address signal of an extremely short pulse is applied to the semiconductor storage, the information D can be written and read according to an address transition detection signal ATD of a predetermined pulse width, thus ensuring that an access address in the storage 14 is altered. Accordingly, the present invention enables reduction of the destruction of data in the storage unit 14 attributed to an ATD signal of a short pulse width in the prior technology. Besides, the improvement in the reliability (sensitivity) of an address transition detecting circuit of the present invention realizes a high speed write/read of the semiconductor storage.

Furthermore, in the semiconductor of the present invention, a resistor R of the address transition detector 18A is formed of the same material as the gate G of the p-channel type field effect transistor Tp and the n-channel type field effect transistor Tn of the complementary transistor circuit 13.

Therefore, the characteristics of transistors associated with irregular processes of each of the complementary transistor circuits (inverters) 13 changes exactly in proportion to the irregular processes of each of resistors R1-R4. Accordingly, a delaying process can be performed accurately regardless of irregular processes between elements.

Thus, the present invention can stabilize the address transition detection and improves the reliability of the semiconductor storage.

The present invention is described in association with the embodiment of the present invention.

Figure 10:
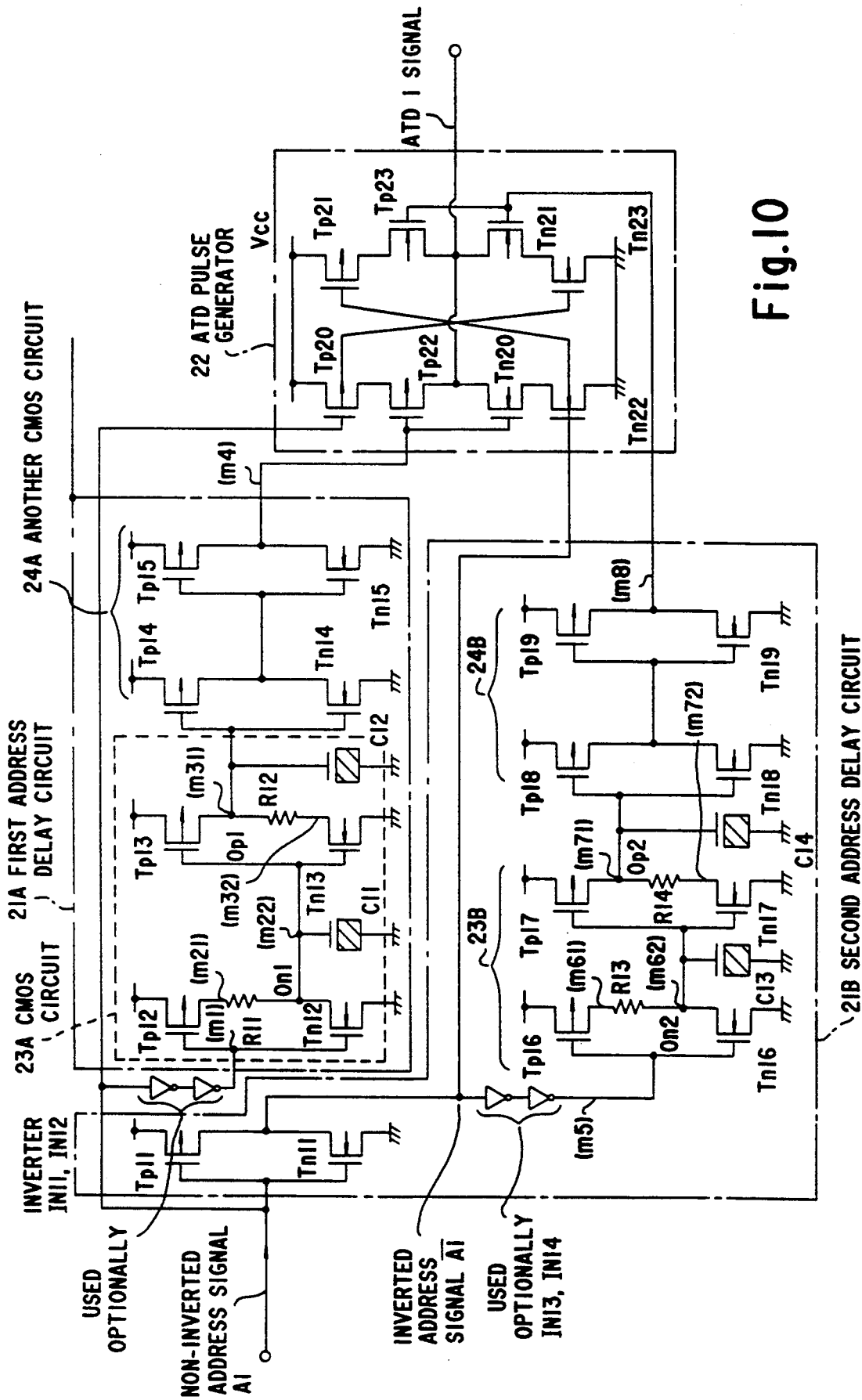
FIG. 10 shows a configuration of an address transition detecting circuit of the first embodiment of the present invention.

FIG. 10 shows the configuration of an address transition detecting circuit of the first embodiment of the present invention.

An address transition detecting circuit detects a change in an address signal A for altering an access address of a memory cell in a RAM, etc. and comprises a first address delay circuit 21A, a second address delay circuit 21B, and an ATD pulse generator 22.

The first address delay circuit 21A is an embodiment of a first address extension circuit 11A. It outputs a non-inverted corrective address signal ADi after delaying, i.e. correcting, an address signal Ai in a plurality of address signals A0-n designating an information storage address. The first address delay circuit 21A comprises inverters IN11 and IN12 and the following CMOS inverter 23A and 24A, etc. The CMOS inverter 23A comprises p-channel field effect transistors (hereinafter referred to as transistors Tpi) Tp12 and Tp13 having the same configuration as that of a plurality of complementary transistor circuits 13, and n-channel field effect transistors (hereinafter referred to as transistors Tni) Tn12 and Tn13; Capacitors C11 and C12 are respectively connected to output parts of each CMOS invertor On1 and Op1. Resistors R11 and R12 are serially connected between transistors Tp12 and Tn12, and Tp13 and Tn13. A CMOS invertor 24A comprises transistors Tp14, Tn14, Tp15, and Tn15.

The capacitor C11 is connected to the output part On1 on the side of the transistor Tn12 of the CMOS inverter comprising transistors Tp12 and Tn12; and the capacitor C12 is connected to the output part Op1 of the transistor Tp13 of the CMOS invertor comprising transistors Tp13 and Tn13.

The configuration of the involved connection is described as follows:

A non-inverted signal is applied to the gate of transistors Tp12 and Tn12 through inverters IN11 and IN12. The drain of transistor Tp12 is connected to the power source, and the source is connected to the drain of transistor Tn12 through resistor R11. The source of transistor Tn12 is grounded.

The connection point between resistor R11 and the drain of transistor Tn12 is connected to one end of a capacitor C11 whose other end is grounded, and to the gate of transistors Tp13 and Tn13. m1, m21, m22, m31, m32, m4, m5, m61, m62, m71, m72, and m8 are nodes indicating main positions where signal outputs of each circuit are observed. Node m1 is a gate input part of the CMOS inverter of the first address delay circuit 21A, node m21 indicates a connection point between the drains of transistor Tp12 and resistor R11, node m22 indicates a connection point between the drain of the transistor Tn12 and resister element R11 and capacitor C11; node m31 indicates a connection point between the drains of transistor Tp13 and resistor R12 and the capacitor element C12; node m32 indicates a connection point between resistor R12 and the drain of the transistor Tn13; and node m4 indicates a drain connection part between transistors Tp15 and Tn15 of another CMOS invertor 24A and an output part of the first address delay circuit 21A. When the level is changed from L (where a non-inverted address signal Ai is activated) to H, the present state where transistor Tp12 is turned ON and transistor Tn12 is turned OFF is inverted to the state where transistor Tp12 is turned OFF and transistor Tn12 is turned ON. When transistor Tn12 is turned ON, the charge accumulated in capacitor C11 is discharged by transistor Tn12. As no resistors are provided between transistor Tn12 and capacitor C11, the discharge terminates immediately. That is, the output On1 of the circuit is changed from H level to L level immediately. If the address signal falls in this state, i.e. it is changed from the H level to the L level, the transistor Tp12 is turned ON and transistor Tn12 is turned OFF, so capacitor C11 is charged through resistor R11. Since the charge is accumulated through resistor R11, the change is made more moderately than when transistor Tn12 is turned on and transistor Tp12 is turned OFF.

When a non-inverted address signal rises and immediately falls, a node m1 takes a similar wave form. By contrast, a node m22 falls promptly and then slowly gets to H level. This takes place because one is discharged without a resistor and the other is charged through a resistor.

The above described output On1 of the CMOS invertor is connected to the gates of transistors Tp13 and Tn13 of the CMOS invertor comprising transistors Tp13 and Tn13. The drain of transistor Tp13 is connected to the power source and the source is connected to the drain of transistor Tn13 through the transistor R12. The source of transistor Tn13 is grounded. The output Op1 of the CMOS invertor is the source of transistor Tp13 to which capacitor C12 is connected, and its output terminal is connected to the gate of another CMOS invertor 24A. Node m5 is a gate input part of CMOS invertor 23B of the second address delay circuit 21B; node m61 indicates a connection point between the drain of transistor Tp16 and resistor R13; node m62 indicates a connection point between the drain of the transistor Tn16 and resistor R13 and capacitor C13; node m71 indicates a connection point between the drain of transistor Tp17 and resister element R14 and the capacitor C14; node m72 indicates a connection point between resistor R14 and drain of the transistor Tn17; and node m8 indicates a drain connection part between transistors Tp19 and Tn19, that is, the output part of the second address delay circuit 21B, of another CMOS invertor 24B.

This circuit has an inverted transistor arrangement of the above described circuit. Therefore, transistor Tp13 is turned ON and transistor Tn13 is turned OFF when output terminal On1 is changed from H level to L level. When transistor Tp13 is turned ON, capacitor C12 is promptly charged, and the electric potential of the node m31 is promptly turned to H level. When output terminal On1 is changed from L level to H level, the transistor Tp13 is turned OFF and transistor Tn13 is turned ON. When transistor Tn13 is turned ON, the electric charge accumulated in capacitor C12 is discharged through resistor R12. Accordingly, the discharge is performed slowly, and the output of node m31 is slowly changed to L level.

Summing up the above described operation, even when an address signal Ai is changed from L level to H level and immediately returned to L level, the quick response to the immediate return to H level and the slow response after the return modify a short pulse to a longer pulse, and then output it from CMOS invertor 23A.

When an address signal is changed from H level to L level and immediately returned to H level, the response is made slowly and the output is given without a response to the change, thus losing an input pulse.

The second address delay circuit 21B is an embodiment of the second address extension circuit, and outputs an address change signal which is an example of an inverted corrective address signal ADi after delaying an inverted address signal Ai of an address Ai in a plurality of the above described addresses A0–An. The second address delay circuit 21B comprises an inverter comprising transistors Tp11 and Tn11, inverters IN13 and IN14, and the following CMOS invertor 23B and 24B. That is, CMOS invertor 23B comprises transistors Tp16, Tp17, Tn16, and Tn17. CMOS invertor 24B comprises transistors Tp18, Tn18, Tp19, and Tn19. Capacitors C13 and C14 are respectively connected to output parts of each CMOS invertor On2 and Op2, and resistors R13 and R14 are serially connected between transistors Tp16 and Tn16, and Tp17 and Tn17.

Capacitor C13 is connected to the output part On2 on the side of transistor Tn16 of CMOS invertor and capacitor C14 is connected to output part Op2 of transistor Tp17 of CMOS invertor 23B. The second address delay circuit 21B has a configuration of the above described first address delay circuit 21A with an inverter comprising transistors Tp11 and T11 provided at the input step. In the above described first address delay circuit 21A, a pulse width is extended when it is short during the interval from the rise to the fall. However, in the second address delay circuit 21B, as the input is inverted, a pulse width is extended when it is short in the interval from the fall to the rise. In the opposite case, the pulse will be lost.

Figure 11:
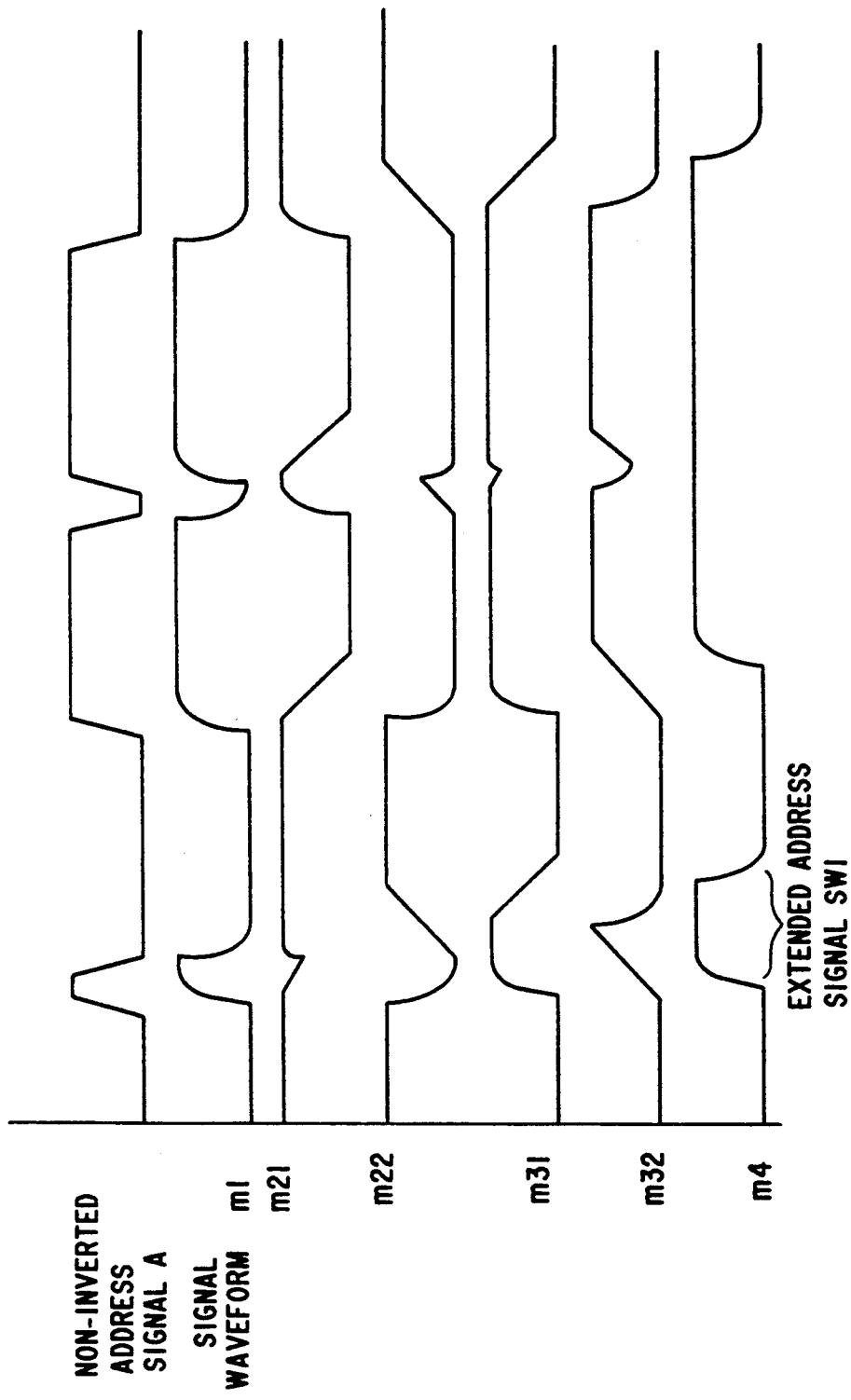
FIG. 11 and 12 show an operational flowchart of an address transition detecting circuit of the first embodiment of the present invention.
Figure 12:
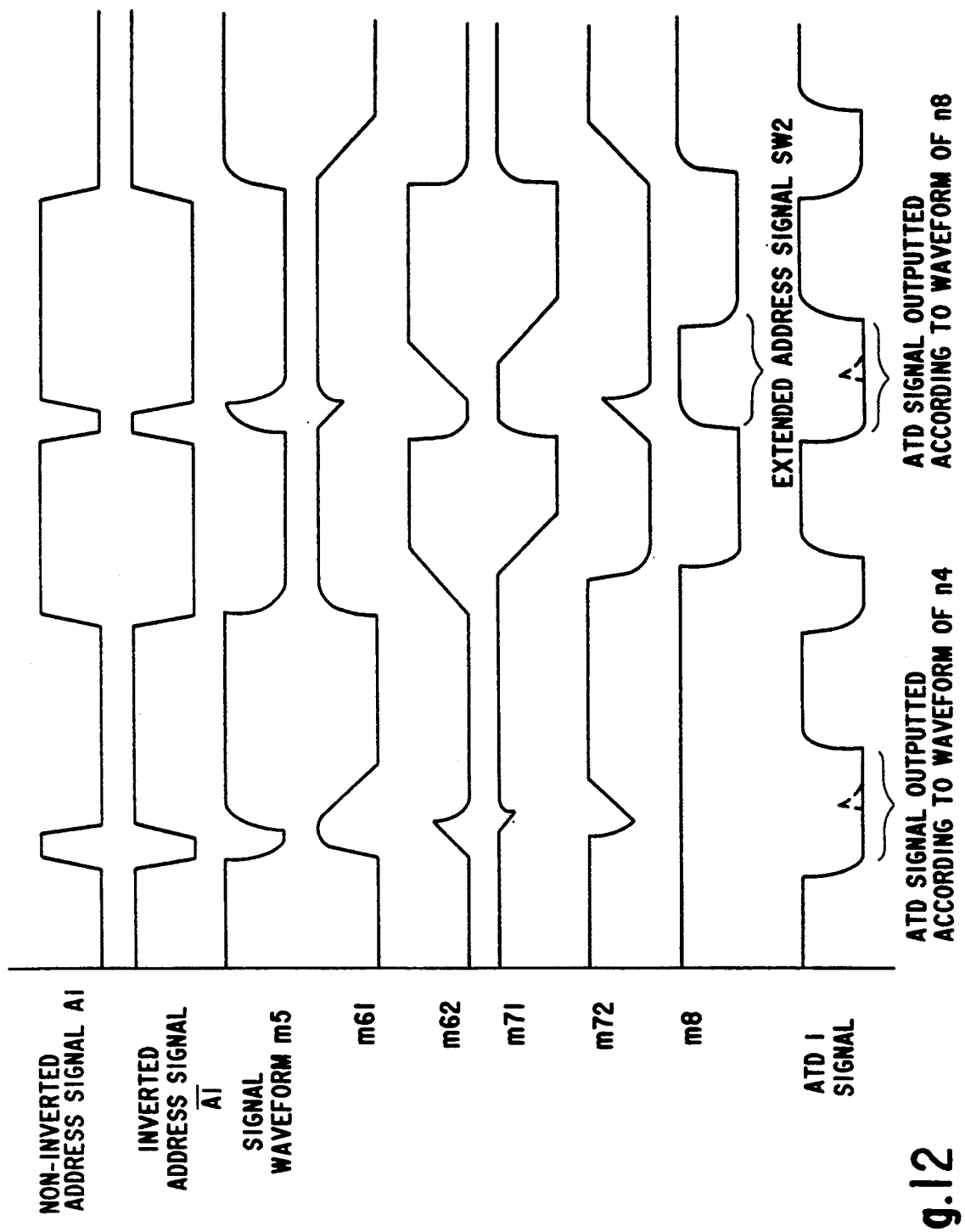

Each of the nodes is described as follows:

FIG. 12 shows inverted arrangements of those in FIG. 11 where a pulse width is extended when a non-inverted address signal Ai is changed from H level to L level and immediately returns to H level. In the reverse case the pulse will be lost. The capabilities of the delay circuit optionally delay an address signal Ai according to a time constant of a resistor R1j (j=1, 2, —) and a capacitor C1j. The different point from the prior art technology is that the pulse is delayed when the non-inverted address signal Ai is changed either from L to H level or from H to L level.

That is, an inverted corrective address signal $\overline{ADi}$ and a non-inverted corrective address signal ADi (address change signal) are delayed on every second step of the CMOS invertor 23 of the first and the second address delay circuits 21A and 21B, and are outputted to an ATD pulse generator 22.

The ATD pulse generator 22 is an embodiment of a signal generating circuit 12, and outputs a transition detection signal ATD in response to a non-inverted address signal Ai, a non-inverted corrective address signal ADi, an inverted address signal $\overline{Ai}$, and an inverted corrective address signal $\overline{ADi}$. The ATD pulse generator 22 comprises p-channel field effect transistors Tp20–Tp23 and n-channel field effect transistor Tn20–Tn23. A non-inverted address signal Ai is applied to the gates of transistors Tp20 and Tn23; a non-inverted corrective address signal ADi is applied at the gates of transistors Tp22 and Tn20; an inverted address signal $\overline{Ai}$ is applied to the gates of transistors Tp21 and Tn22; and an inverted corrective address signal $\overline{ADi}$ is applied to the gates of transistors Tp23 and Tn21. The drains of transistors Tp20 and Tp21 are connected to the power source, and the source is connected to the drains of transistors Tp22 and Tp23. The sources of transistors Tp22 and Tp23 are connected to the drains of transistors Tn20 and Tn21, and the sources of transistors Tn20 and Tn21 are connected to the drains of transistors Tn22 and Tn23. An address transition detection signal ATDi is outputted from the point where respective drains of transistors Tp22 and Tn20, and transistors Tp23 and Tn21 are connected.

The ATD pulse generator 22 is a circuit which responds to a non-inverted address signal Ai and an output of the first address delay circuit 21A, and outputs an ATD signal of L level when the non-inverted address signal has a short pulse in the direction of H level. It also responds to a inverted address signal $\overline{Ai}$ and output of the second address delay circuit 21B, and outputs an ATD signal of L level when the non-inverted address signal Ai has a short pulse in the direction of H level.

FIGS. 11 and 12 show an operational time chart of an address transition detecting circuit associated with the first embodiment of the present invention. FIG. 11 and 12 show variations of signal waveform of a non-inverted address signal A and respective nodes (output points) m1, m21, m22, m31, m32, m4, m5, m61, m62, m71, m72, and m8 of the first and second address delay circuit 21A and 21B.

Figure 1:
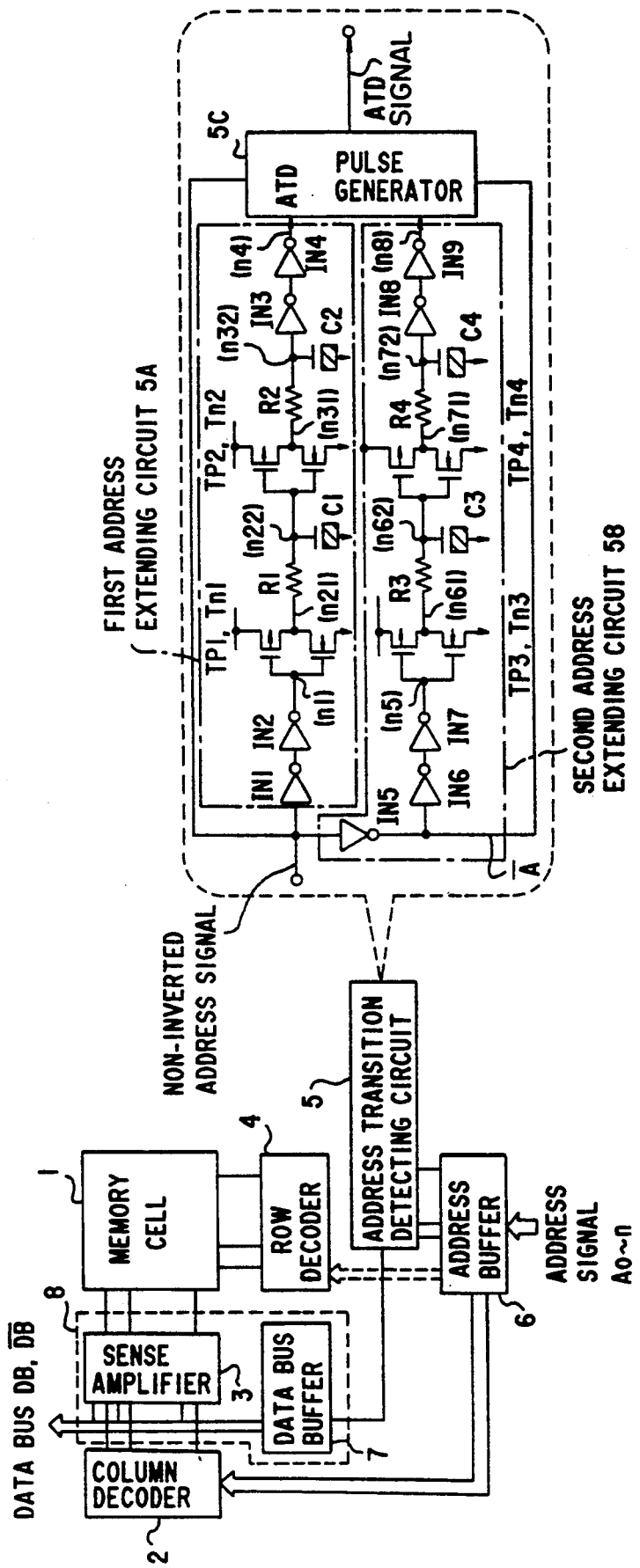
FIG. 1 shows a configuration of a RAM built in an address transition detection circuit in the prior art technology.
Figure 2:
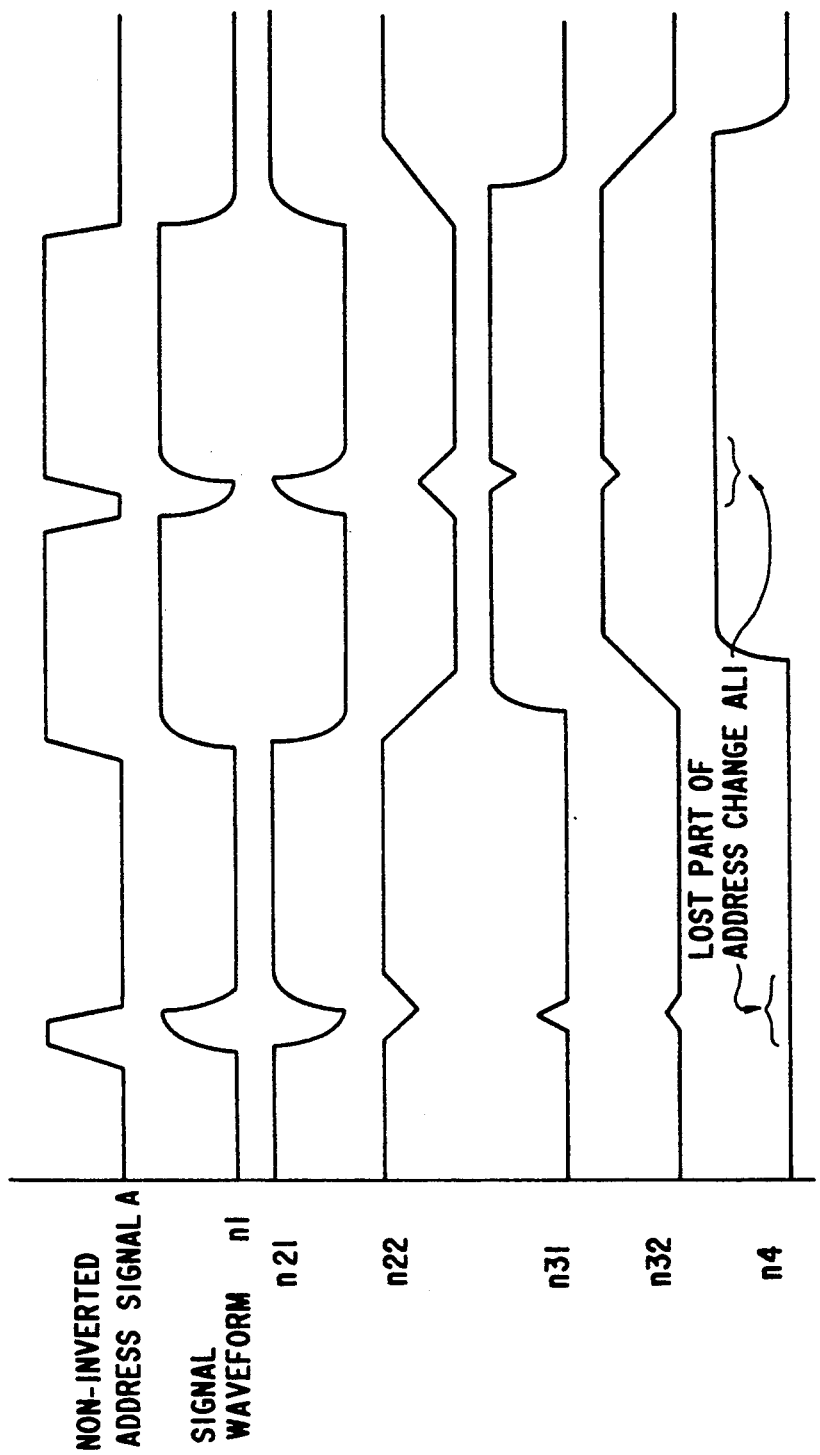
FIGS. 2 and 3 show operational time charts of an address transition detecting circuit of the prior art technology.
Figure 3:
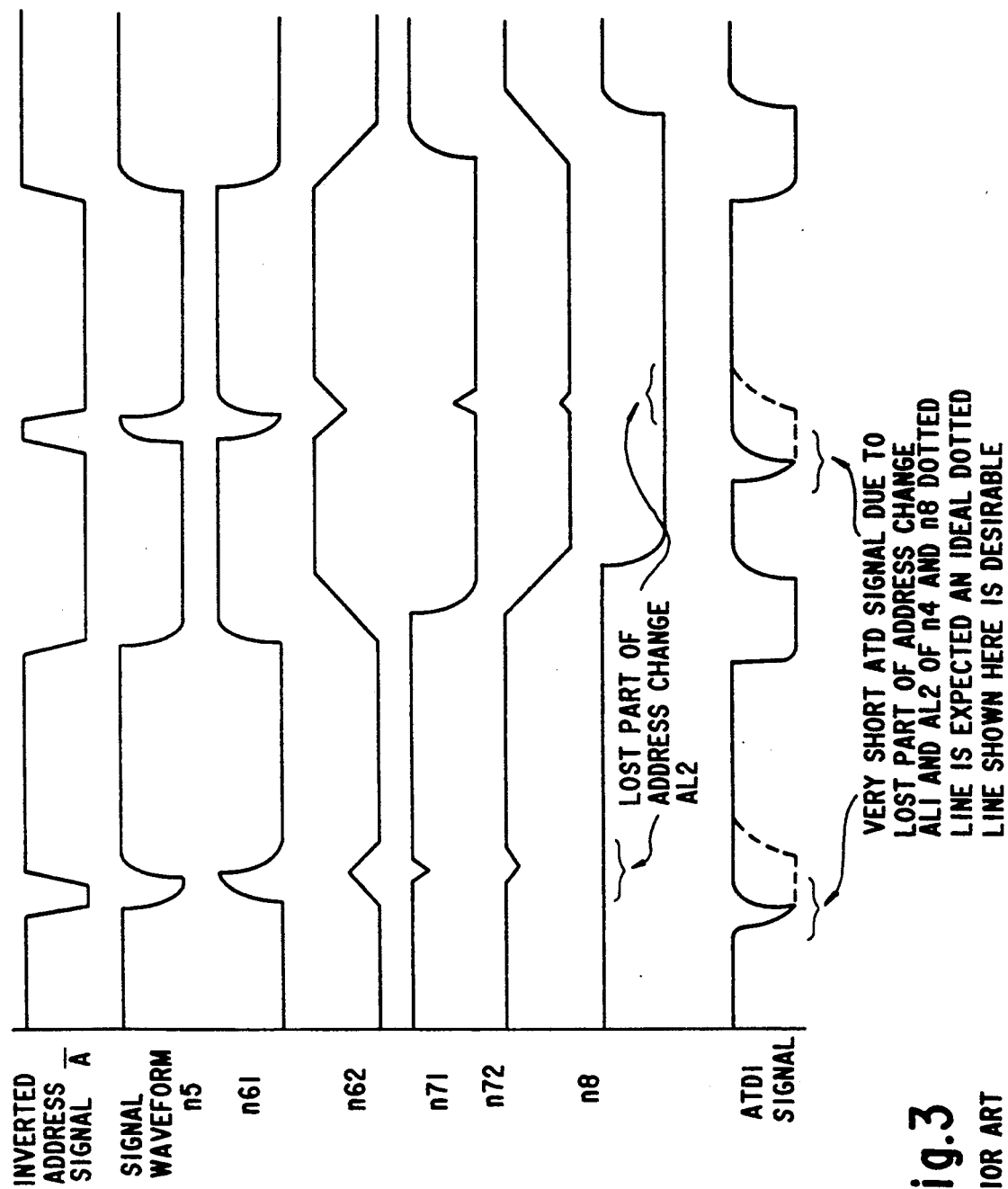
Figure 4:
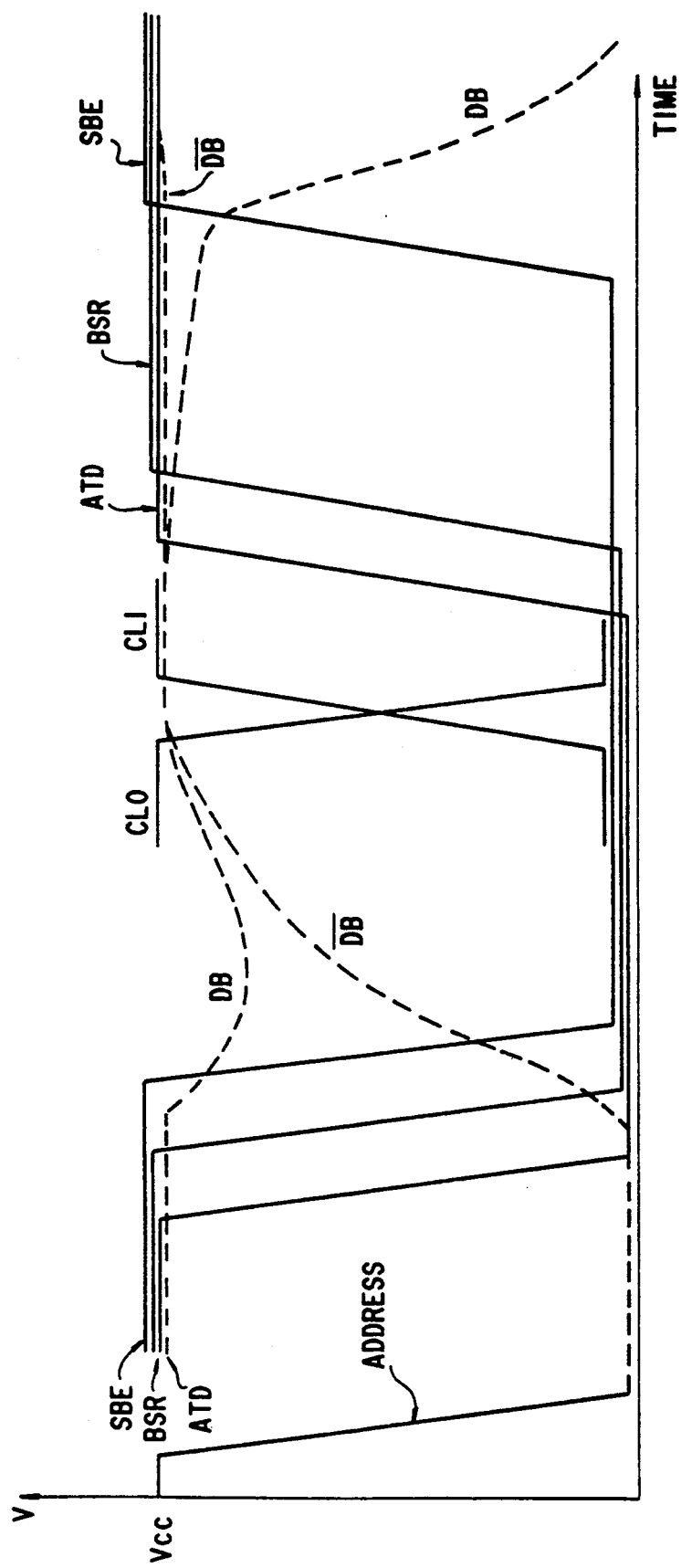
FIG. 4 shows wave forms of BSR, SBE, CL, and DB signals with a normal address pulse width.
Figure 5:
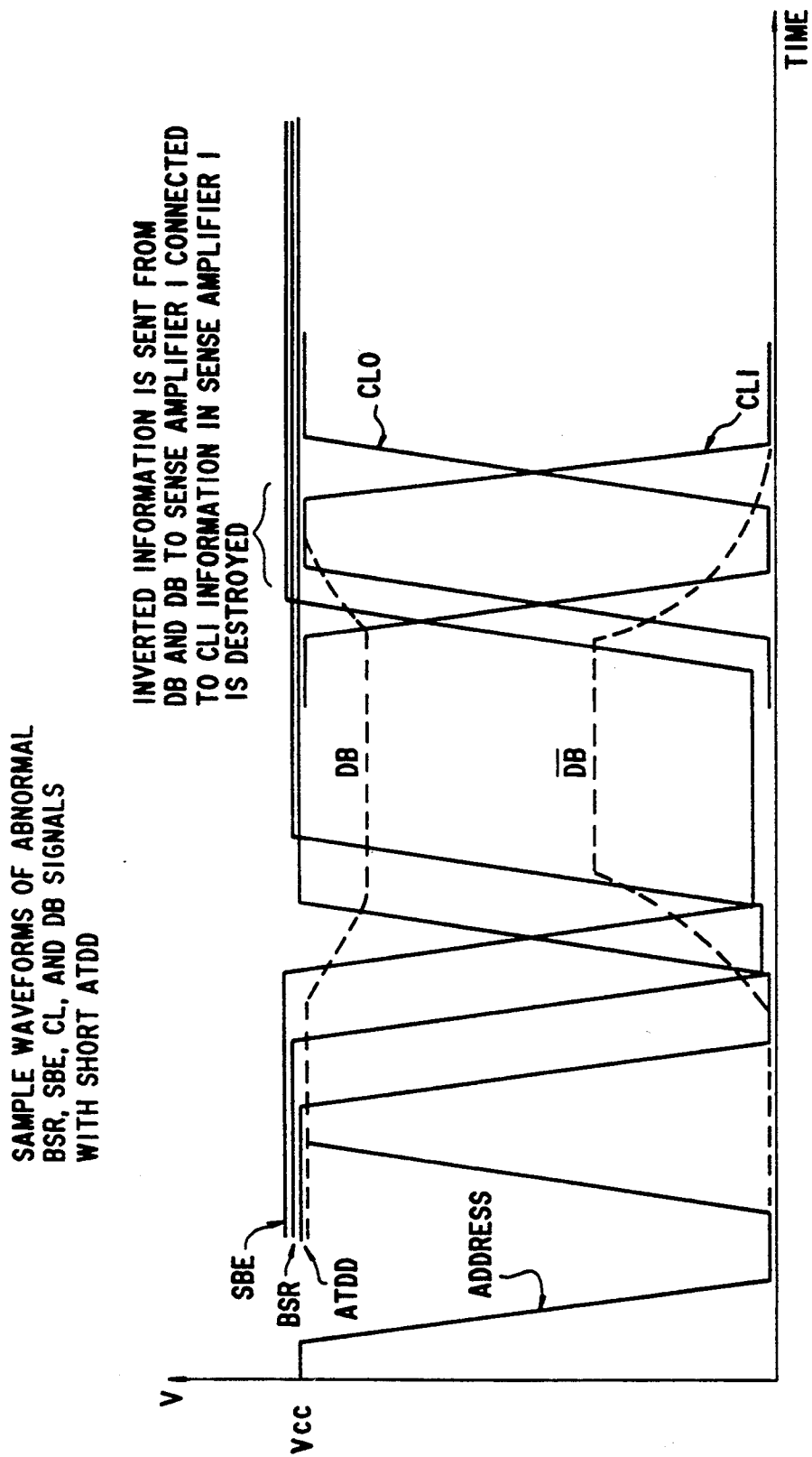
FIG. 5 shows wave forms of BSR, SBE, CL, and DB signals with an abnormal address pulse width.
Figure 6:
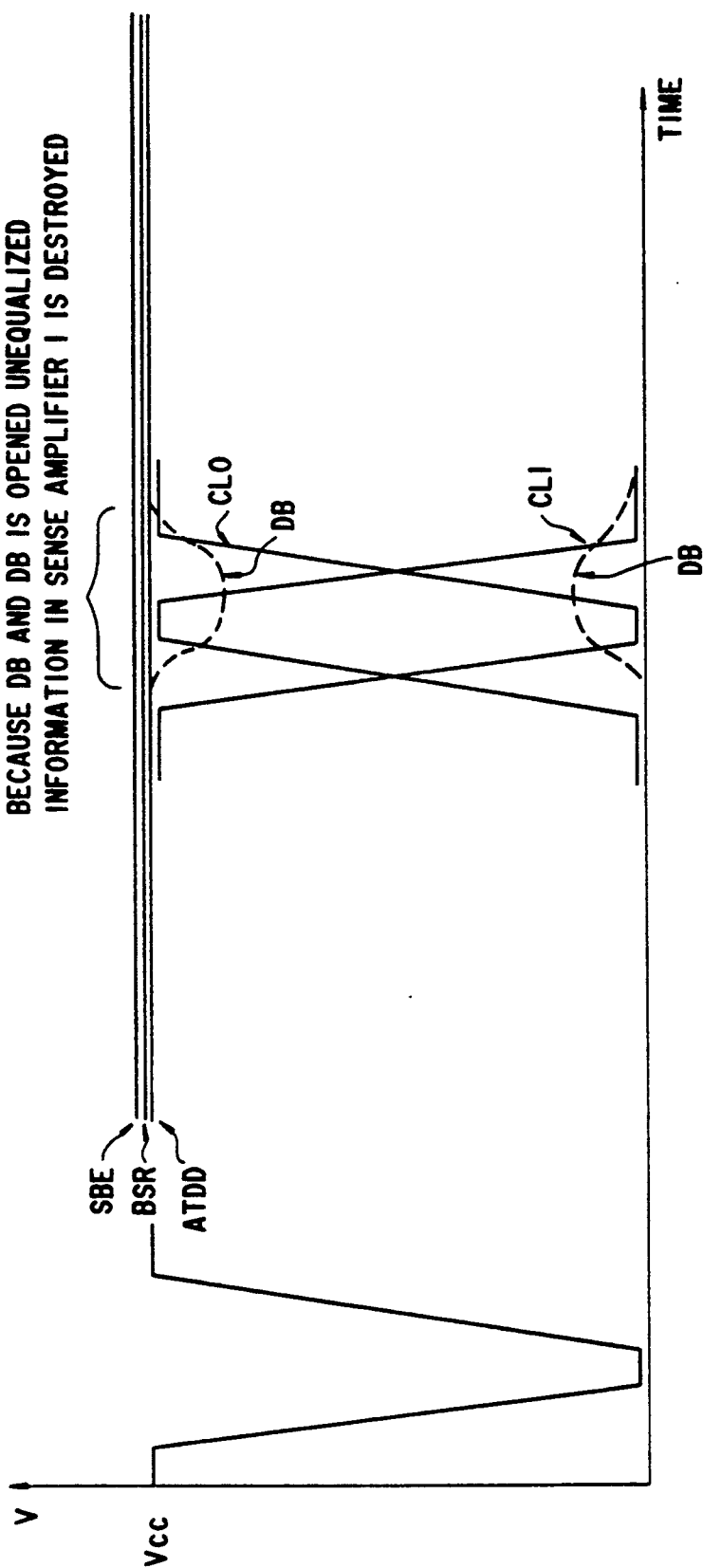
FIG. 6 shows wave forms of BSR, SBE, CL, and DB signals in the abnormal condition where no ATD is outputted.

If, in FIG. 12, a non-inverted address signal A of one address signal Ai of a plurality of address signals A0–An designating an information storage address in a memory cell, etc. is applied to the first address delay circuit 21A, it is delayed by inverters IN11 and IN12, CMOS invertor 23A, and another CMOS invertor 24A. Then, CMOS invertor 24A outputs an address change signal to the ATD pulse generator 22. An SW1 is an extended address signal indicating the signal waveform at node m4 of the output part of the first address delay circuit 21A. When a short pulse address signal is applied to Inverter IN11, the circuit configuration of the prior technology incurs a lost part of address change AL1 as shown in FIG. 2, while the embodiment of the present invention does not. For example, when the address changes either in the rise from L level to H level or in the fall from H level to L level, delay is generated in the output of CMOS invertor 23A, either in the rise or the fall, through resistor R11 and capacitor C11, and is not generated in the other. This holds true with a time constant associated with capacitor C13 x resistor R13 in the later step, thereby reducing the lost part of the address change.

FIG. 12 shows an inverted address signal $\overline{A}$, and variations of signal waveforms associated with each node m5–m8 of the second address delay circuit 22B and associated with an ATD signal.

In FIG. 12, when a non-inverted address signal A is inverted by an inverter comprising transistors Tp11 and Tn11 and applied to address delay circuit 21B, it is delayed by CMOS invertor 23B and another CMOS circuit 24B, and an address change signal $\overline{ADi}$ is outputted by CMOS invertor 24B to the ATD pulse generator 22. SW2 is an extended address signal, and indicates a signal waveform at node m8 of the output part of the second address delay circuit 21B. This also holds true with the extended address signal SW1 of the first address delay circuit 21A. Address delay circuit 21B is the same as address delay circuit 21A except that it has an inverter in the input step. It generates a delay when an address value is changed from H level to L level and immediately returned from L level to H level, generating an address signal SW2.

Address delay circuit 21A delays a short pulse in the positive direction to extend the pulse width, while the address delay circuit 21B delays a short pulse in the negative direction to extend the pulse width. An address transition detection signal ATDi can be generated using the results from both the circuits.

The operation and output involved with a short pulse in the positive and negative directions in the first address delay circuit 21A and the second address delay circuit 21B are described above. The operation of the ATD pulse generator 22 is explained as follows. The ATD pulse generator 22 is provided with 4 circuit sets each with two transistors connected serially. An output ATDi signal is turned to H level or L level when a pair of the transistors is turned ON. H level is output when the transistors Tp20, Tp22, TP21, and TP23 are turned ON; and the L level is output when transistors Tn20, Tn22, Tn21, and Tn23 are turned ON. Transistors Tp20, Tp21, Tp22, Tp23, Tn20, Tn21, Tn22, and Tn23 are turned ON and OFF under control of a non-inverted address signal Ai, inverted address signal $\overline{Ai}$, non-inverted corrective address signal ADi, and an inverted corrective address signal $\overline{ADi}$.

Figure 13:
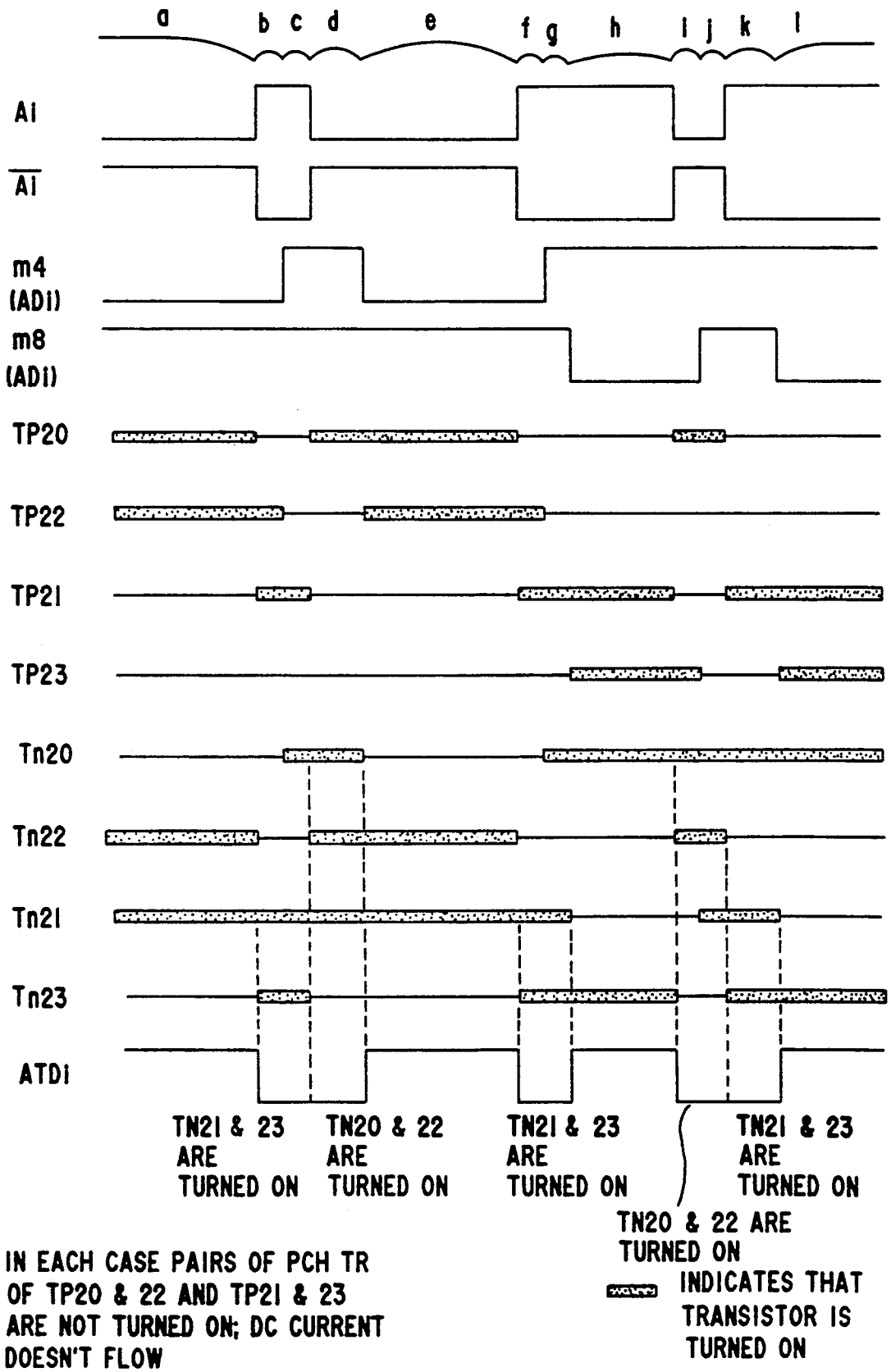
FIG. 13 shows an explanatory view of the operation of an ATD pulse generator.

In FIG. 13, as both transistors Tp20 and Tp22 are turned ON at state a, the address transition detection signal ATDi keeps H level. Since transistors Tn21 and Tn23 are turned ON at states b and c and f and g, and transistors Tn20 and Tn22 are turned ON at state d, the signal is turned to L level. As state e is the same as state a, the signal is turned to H level.

On the other hand, when a non-inverted address signal is turned from L level to H level and immediately returned to L level at states i and j, transistors Tn20 and Tn22 are turned ON, and address transition detection signal ATDi is turned to L level. Transistors Tn21 and Tn23 are ON at state k, and address transition detection signal ATDi keeps L level. The transistors Tp21 and Tp23 are turned on at state 1, and address transition detection signal ATDi is changed to H level.

Even a short time change is transmitted to the ATD pulse generator 22 with delay by a corrective address signal ADi and an inverted corrective address signal, so the address transition detection signal can be turned to L level.

Even when the pulse width of an address signal Ai gets too small for some reason, a lost part of address change AL1 or AL2 can be prevented from being generated and ruining the wave top of a non-inverted corrective address signal ADi and an inverted corrective address signal $\overline{ADi}$ as detected in the prior art technology.

Therefore, even though an address signal Ai with a small pulse width is applied to the address transition detection circuit, any change can be detected and an address transition detection signal ATD of a predetermined pulse width can be output to the following circuit such as data bus buffer, etc. This ensures that an address to access a memory cell is altered.

Figure 14:
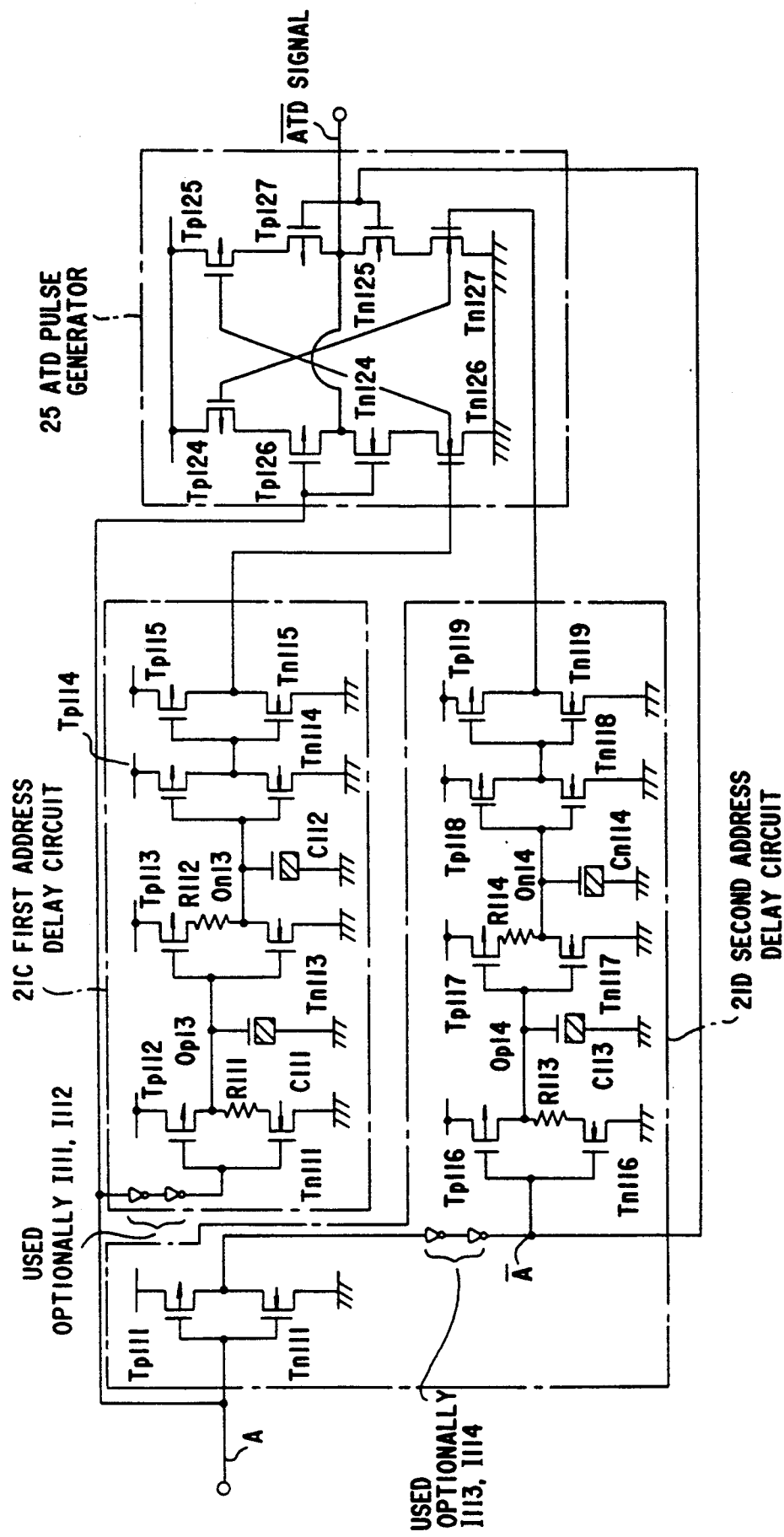
FIG. 14 shows a configuration of an address transition detecting circuit of the second embodiment of the present invention.

FIG. 14 shows a configuration of an address transition detection circuit related to the second embodiment of the present invention.

As shown in FIG. 14, the second embodiment differs from the first embodiment in that an inverted address transition detection signal ATD is output from the ATD pulse generator 22.

That is, the address transition detection circuit related to the second embodiment comprises the first address delay circuit 21C, the second address delay circuit 21D, and the ATD pulse generator 25. It differs from the first embodiment in that capacitors C111 and C112 forming the CMOS invertor of the first address delay circuit 21C are connected to the output parts Op13 and On13 of transistors Tp112 and Tn113. Besides, capacitors C113 and C114 forming the CMOS invertor of the second address delay circuit 21D are connected to the output parts Op14 and On14 of transistors Tp116 and Tn117. Resistors R111 and R112 are serially connected between transistors Tp112 and Tn112, and transistors Tp113 and Tn114 are arranged in the same manner as in the first embodiment. Inverters IN111, IN112, IN113, and IN114 are skipped if possible.

An ATD pulse generator 25 comprises p-channel field effect transistors Tp124–Tp127 and n-channel field effect transistors Tn124–Tn127. A non-inverted address signal Ai is applied to the gates of transistors Tp126 and Tn124; a non-inverted corrective address signal ADi is applied to the gates of transistors Tp125 and Tn126; an inverted address signal $\overline{Ai}$ is applied to the gates of transistors Tp127 and Tn125; and an inverted corrective address signal $\overline{ADi}$ is applied to the gates of transistors Tp124 and Tn127. An inverted address transition detection signal ATD is output from the connection point where respective drains between transistors Tp126 and Tn124, and Tp127 and Tn125 are connected. Thus, the address transition detecting circuit of the second embodiment of the present invention comprises a first address delay circuit 21C, a second address delay circuit 21D, and an ATD pulse generator 25 as shown in FIG. 14. Resistors R111–R114, forming a part of the first and the second address delay circuit 21C and 21D, are serially connected between transistors Tp112, Tn112, Tp113, Tn113 and Tp116, Tn116, TP117, Tn117 of the CMOS invertor. Capacitors C111–C114 are connected to the output parts Op13 and On13 on the sides of the transistors Tp112 and Tn113 of the CMOS invertor, and to the output parts Op14 and On14 on the sides of transistors Tp116 and Tn117.

Accordingly, one non-inverted address signal Ai of a plurality of addresses A0–An designating an information storage address is delayed by the first address delay circuit 21C; the non-inverted corrective address signal ADi is outputted to the ATD pulse generator 25; and an inverted address signal Ai of one address Ai is delayed by the second address delay circuit 21D and an inverted corrective address signal ADi is output to the ATD pulse generator 25. As in the first embodiment, when the non-inverted address signal Ai migrates either from L to H or H to L, that is, in every second step of the CMOS invertor of the first and second address delay circuits 21C and 21D, an inverted corrective address signal $\overline{ADi}$ and a non-inverted corrective address signal ADi (address change signal) are delayed.

Even when the pulse width of an address signal Ai gets too small for some reason, as in the first embodiment, a lost part of address change AL1 or AL2 can be prevented from being generated and ruining the wave top of a non-inverted corrective address signal ADi and inverted corrective address signal $\overline{ADi}$ as detected in the prior art technology.

Therefore, even though an address signal Ai with a small pulse width is applied to the address transition detection circuit as in the first embodiment, any change can be detected and an inverse address transition detection signal $\overline{ATD}$ of a predetermined pulse width can be output to the following circuit, such as a data bus buffer, etc. This ensures that an address to access a memory cell is altered as in the first embodiment.

Figure 15A:
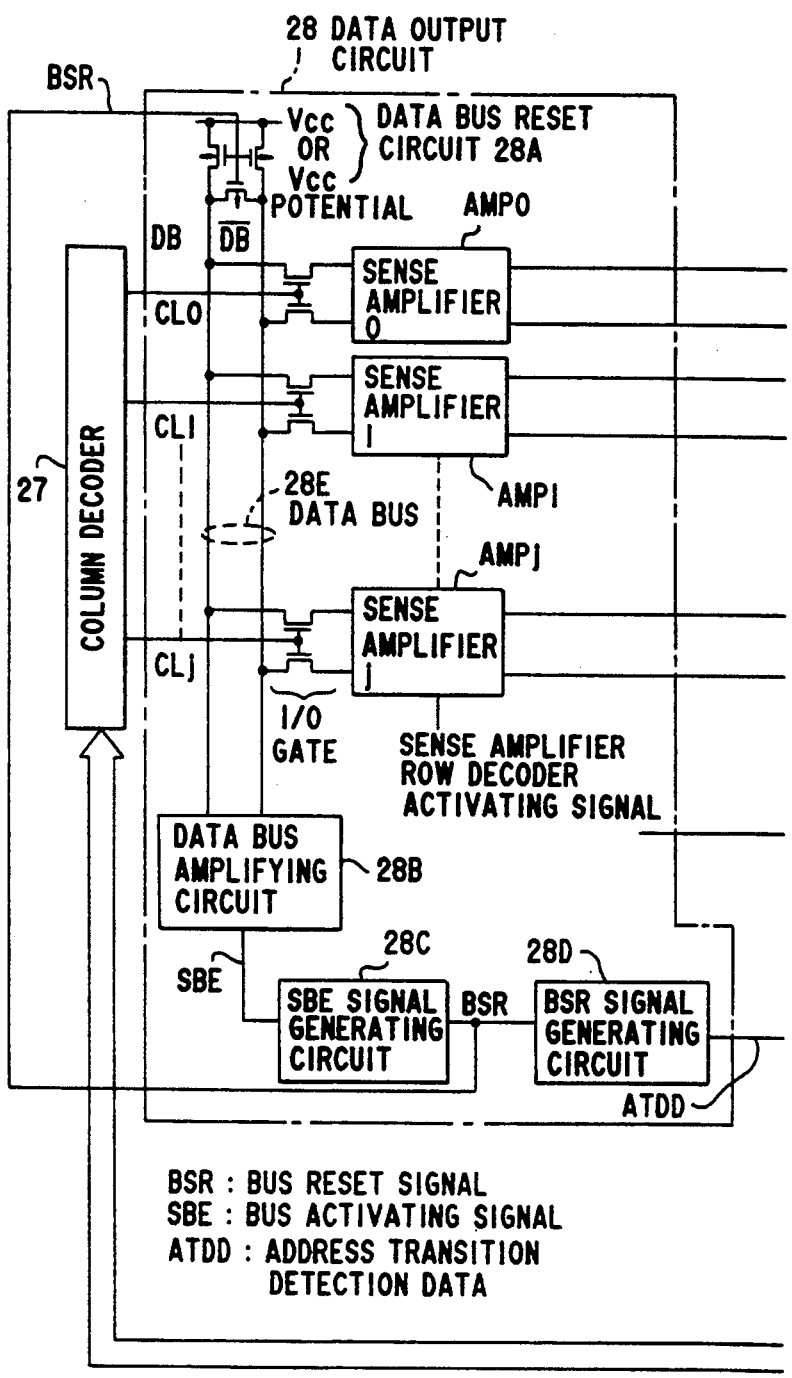
FIGS. 15, 15A, and 15B show a configuration of a semiconductor unit of the first embodiment of the present invention.
Figure 15:
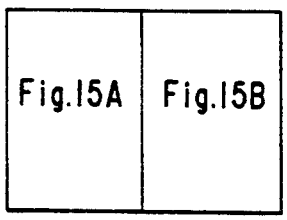
Figure 15B:
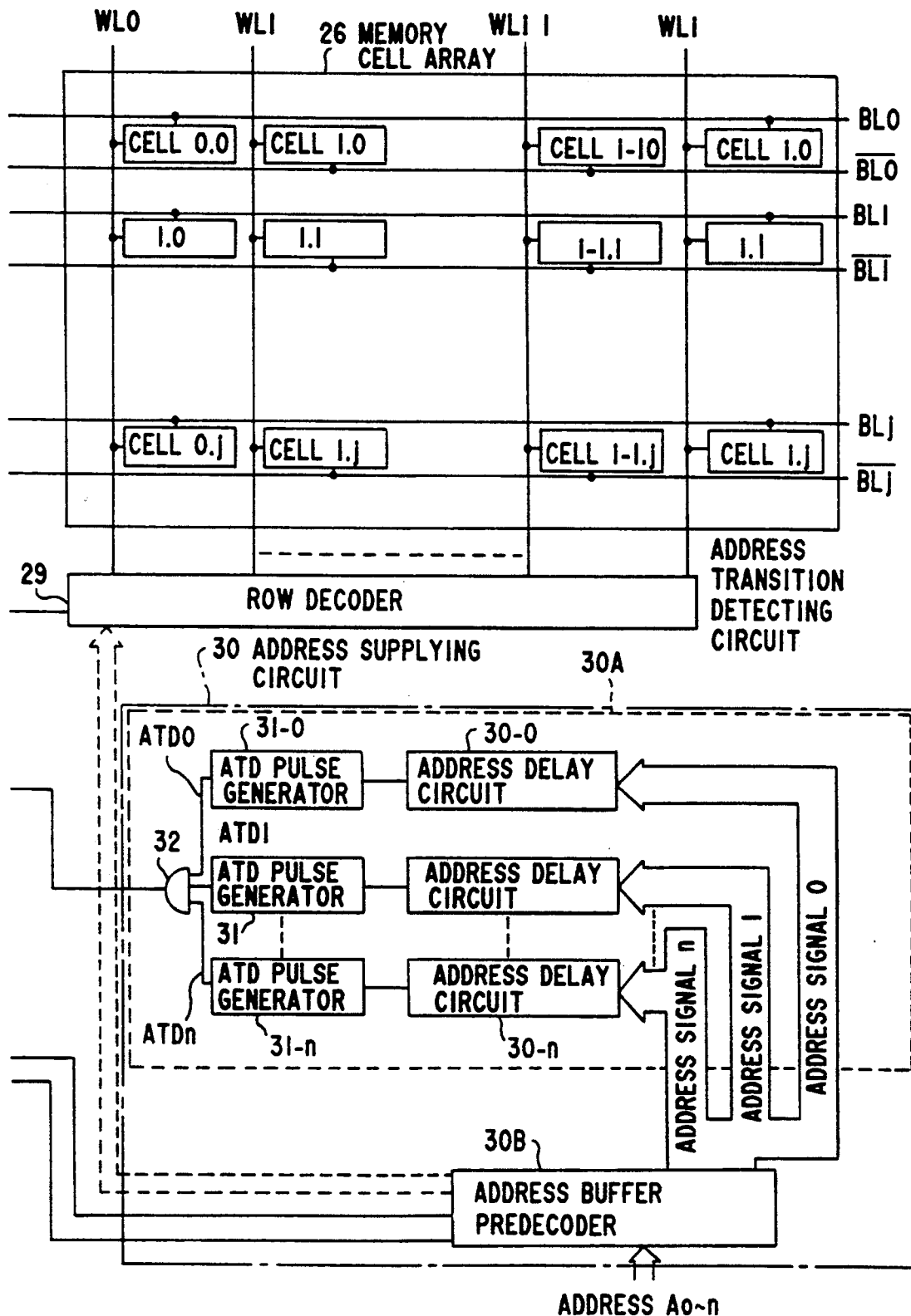

FIG. 15 shows a configuration of a semiconductor associated with the first and second embodiments of the present invention, and shows a block diagram of a dynamic RAM, etc. provided with a flip-flop type data path amplifier.

In FIG. 15, a dynamic RAM for detecting any change in an address signal and altering an access address of a memory cell comprises a memory cell array 26, a column decoder 27, a data output circuit 28, row decoder 29, an address supply circuit 30, etc.

That is, the memory cell array 26 is an embodiment of a storage unit 14 and stores information D. A cell ij such as a 1 Tr 1 capacitor circuit, etc. is used for the memory array 26.

A column decoder 27 is an embodiment of a column selector 15 and selects a bit line Bli in the memory cell array 26 in the column direction and a cell ij connected to the BLi.

A data output circuit 28 is an embodiment of an information output unit 16, and controls the read/write of the information D. A data output circuit 28 comprises a data bus reset circuit 28A, a data bus amplifying circuit 28B, a bus activation signal (hereinafter referred to as an SBE signal) generating circuit 28C, a bus reset signal (hereinafter referred to as a BSR signal) generating circuit 28D, a data bus 28E and sense amplifiers AMP-1–AMPj.

Figure 16:
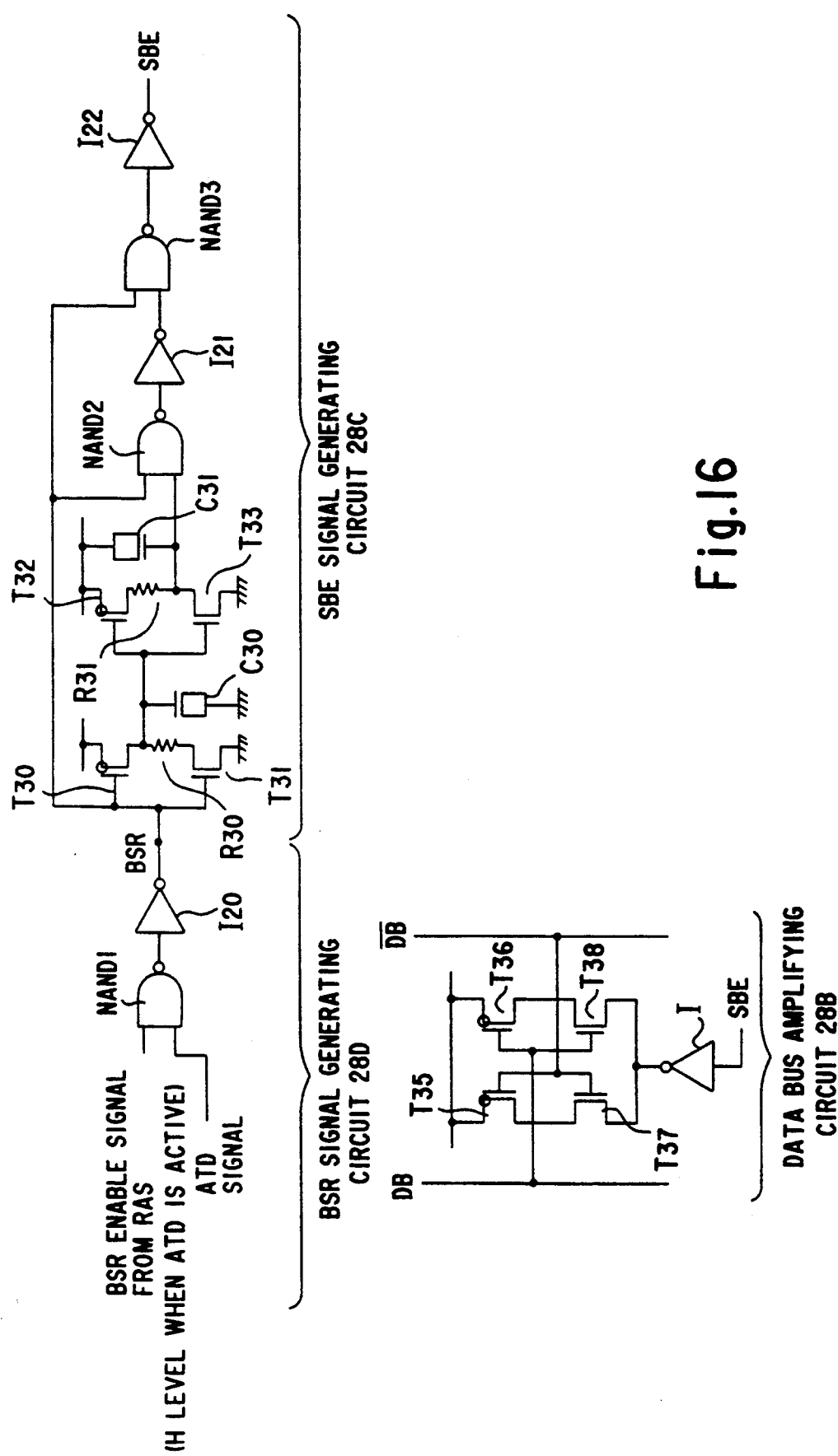
FIG. 16 shows views of a BSR signal generating circuit, an SBE signal generating circuit, and a data bus amplifying circuit.

FIG. 16 shows detailed views of a BSR signal generating circuit 28D, SBE signal generating circuit 28C, and data bus amplifying circuit 28B. Although an ATD signal only is applied to the BSR signal generating circuit 28 as shown in FIG. 15, a BSR enable signal is actually applied from the RAS. The BSR signal generating circuit 28D comprises a NAND gate NAND1 and an inverter I20. The above described BSR enable signal and ATD signal are applied to NAND gate NAND1, and when ATDD signal show L level, the inverter I20 outputs L level, which is recognized as a BSR signal.

This BSR signal is applied to the SBE signal generating circuit. That is, it is applied to the delay circuit equivalent to the first address delay circuit 21C shown in FIG. 14. The delay circuit comprises transistors T30, T31, T32 and T33; resistors R30 and R31: and capacitors R30 and R31. The BSR signal is delayed in this delay circuit; a NAND logic relative to the BSR signal without delay is obtained at the NAND2 gate; the output is inverted by the inverter I21; similarly a NAND logic is obtained at the NAND3 gate; and the output is inverted by the inverter I22. The SBE signal obtained by the SBE signal generating circuit is applied to the data bus amplifying circuit 28B. Transistors T30, T32, T35, and T36 are p-channel transistors and are marked with a small circle. This holds true for capacitor C31.

The data bus amplifying circuit comprises transistors T35, T36, T37, and T38. It temporarily stops the circuit as inactive when an SBE signal is not applied.

Row decoder 29 is an embodiment of row selector 17. It selects word lines WL0–WLi of the memory cell array 26 in the row direction.

The address supply circuit 30 is an embodiment of the address supplier 18. It supplies the column decoder 27 and the row decoder 29 with addresses A0–An. The address supply circuit 30 comprises an address transition detection circuit 30A and an address buffer predecoder 30B which is an example of an input/output unit 18B. The address transition detection circuit 30A is the address transition detection circuit related to the first and second embodiments.

The address transition detection circuit 30A comprises an address delay circuit 30-0 for detecting the change in an address signal A0; an ATD pulse generator 31-0 for outputting a first address transition detection signal ATD0 according to the change; an address delay circuit 30-1 for detecting the change in an address signal A1; an ATD pulse generator 31-1 for outputting a second address transition detection signal ATD1 according to the change; an address delay circuit 30-n for detecting the change in an address signal An; an ATD pulse generator 31-n for outputting the n-th address transition detection signal ATDn according to the change; and an AND logical circuit 32 for performing n input AND logical operations of the 1st–n-th address transition detection signals ATD0–ATDN.

The resistor R of the address transition detection circuit 30A is made of similar quality material to the gate G of the p-channel field effect transistor Tpi and n-channel field effect transistor Tni of the CMOS invertor associated with the first and the second embodiments.

Thus, the dynamic RAM associated with the first embodiment of the present invention comprises a memory cell array 26, a column decoder 27, a data output circuit 28, a row decoder 29, and an address supply circuit 30. An address transition detection circuit 30A in the address supply circuit 30 comprises the address transition detection circuit associated with the first and second embodiments.

For example, when information D is stored in a cell ij in the memory cell array 26, the address supply circuit 30 supplies the column decoder 27 and the row decoder 29 with addresses A0–An. In this address transition detection circuit 30, any change is detected by each of the address delay circuits 30-0–30-n and each of the ATD pulse generators 310–31n even if an address signal Ai of a small pulse width is input and one of the 1st–n-th address transition detection signals ATD0–ATDn of a predetermined pulse width is output according to the change to the AND logical circuit 32. The AND logical circuit 32 performs n input AND logical operations, and the address transition detection data ATDD is output to the BSR signal generating circuit 28D.

The BSR signal generating circuit 28D generates a BSR signal according to the data ATDD, and the BSR signal is output to the SBE signal generating circuit 28C and the data bus reset circuit 28A. The SBE signal generating circuit 28C generates an SBE signal accord to the BSR signal, and the SBE signal is output to the data bus amplifying circuit 28B.

Then, the column decoder 27 selects a bit line BLi running in the column direction of the memory cell array 26, and the row decoder 29 selects a word line WLi running in the row direction of the memory cell array. Thus, the read control of the information D is performed such that the input/output in the data bus reset circuit 28A can be controlled according to a BSR signal. The input/output in the data bus amplifying circuit 28B and the sense amplifiers AMP0–AMPj can also be controlled according to an SBE signal.

Therefore, the information D can be written/read according to the address transition detection data ATDD of a predetermined pulse width even though an address signal of a very small pulse width is input to the address supply circuit 30. This ensures that an address is altered to access the memory cell array 26.

Accordingly, the destruction of data in the memory cell array attributed to an ATD signal with a small pulse width can be prevented effectively. Besides, the improved reliability (sensitivity) of the address transition detection circuit enables high-speed write/read of the dynamic RAM.

Furthermore, in the dynamic RAM of the present invention, the resistor R of the address transition detection circuit 30A is made of a similar quality material to gate G of the p-channel field effect transistor Tpi and n-channel field effect transistor Tni of the CMOS invertor.

Therefore, the variation of the characteristics of a transistor attributed to different processes by CMOS invertor generates different processes for resistors R11–R14. The delay process can be performed accurately regardless of these different processes.

Thus, the address transition detection can be performed stably and the reliability of the RAM can be improved.

Figure 17B:
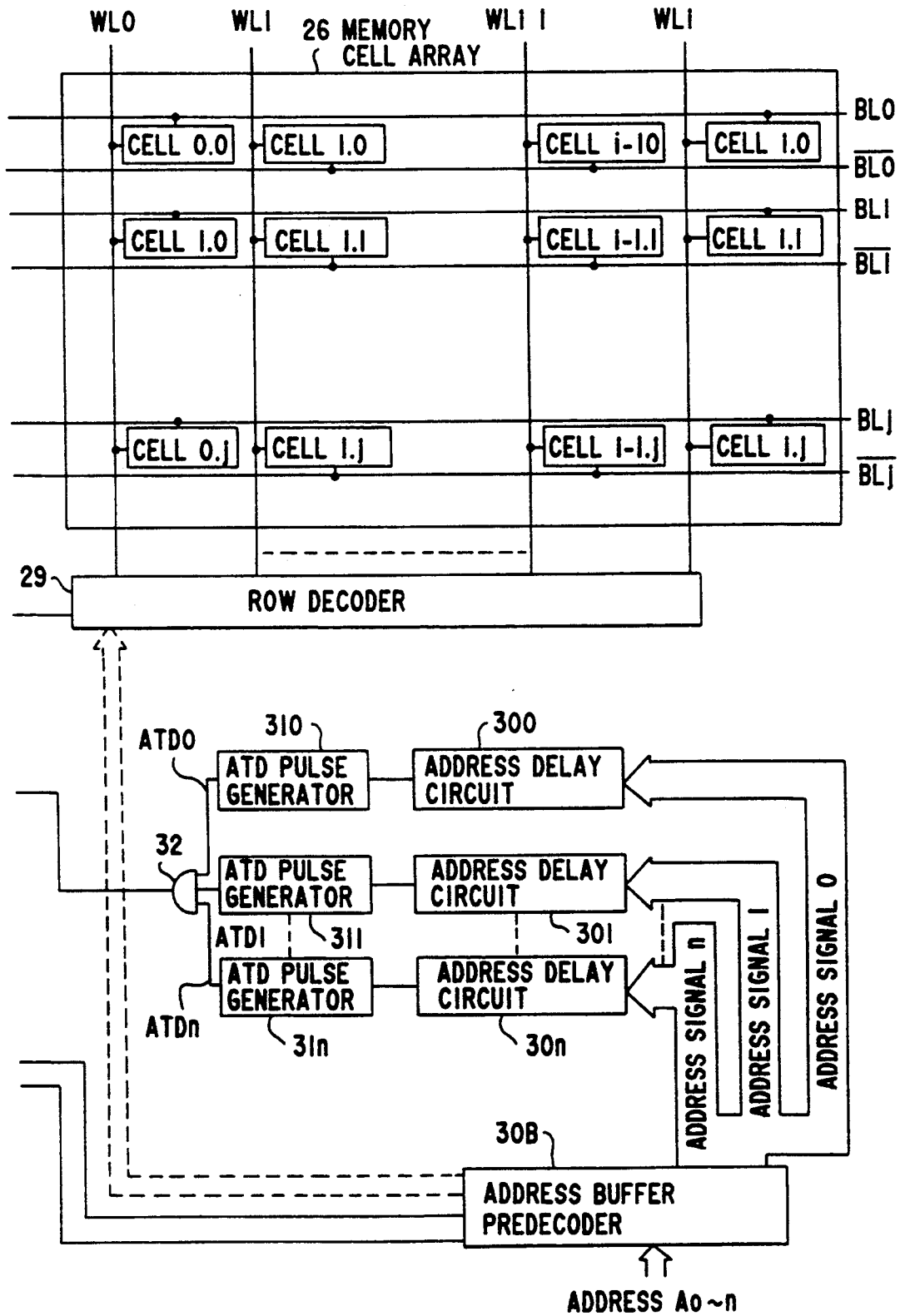

FIG. 17 shows another configuration of a semiconductor storage unit associated with the first and second embodiment of the present invention.

FIG. 17 shows that the second application differs from the first application in that a current mirror circuit activation/deactivation signal (hereinafter referred to as an SBC signal) SBC is generated according to address transition detection data ATDD.

That is, 33A is a data bus amplifying circuit (current mirror). It activates/deactivates a data bus 33C according to the activation/deactivation signal SBC.

33B is an SBC signal generating circuit. It generates an SBC signal in response to the address transition detection data ATDD from the AND logical circuit 32.

(Items assigned with the same symbols as those in the first application are skipped here as they have the same capabilities).

Thus, in the RAM of the second embodiment of the present invention, a data bus amplifying circuit (current mirror) 33B is controlled according to the address transition detection data ATDD.

For example, the data bus 33C is activated when information D stored in a cell ij of the memory cell array 26 is written/read, and otherwise, the bus 33C is deactivated, that is, powered off.

Accordingly, the data bus 33C can be controlled exactly through the data bus amplifying circuit (current mirror) according to the address transition detection data ATDD with a predetermined pulse width, even though an address signal with an extremely small pulse width is input to the address supply circuit 30, thus minimizing the consumption of electric power by the RAM.

The address transition detection data ATDD can be applied as a logical signal of a decoder for controlling ON and OFF of transfer gates between the sense amplifiers AMP0–AMPn and the data bus 33C.

In the first and the second embodiments of the present invention, the electric current is controlled using resistors R11, R12, R13, R14, R111, R112, R113, and R114 when capacitors C11, C12, C13, C14, C111, C112, C113, and C114 are charged or discharged. However, it is obvious that it can be controlled in other ways. For example, the area of a transistor which controls the current can be reduced to attain the same effect.

As described above, the address transition detecting circuit of the present invention comprises first and second address extending circuits and a signal generating circuit, wherein a capacitor forming a part of the first and the second address extending circuits is connected serially between the p-channel type field effect transistor and the n-channel type field effect transistor of the complementary transistor circuit, and the capacitor is connected to the output part of the p-channel type field effect transistor side and to the output part of the n-channel type field effect transistor side of the complementary transistor circuit.

Therefore, even when a pulse width Of an address signal gets too short for some reason, the lost portion of the address change can be prevented from being generated and from causing the destruction of the peak of a non-inverted corrective address signal and an inverted corrective address signal as detected in the prior art technology. Thus, even though an address signal with a short pulse width is applied to the address transition detection circuit, the change can be detected and an address transition detection signal with a predetermined pulse width can be output to the following circuit such as a data buffer.

The present invention comprises a storage unit, a column selector, an information output unit, a row selector, and an address supplier. The address transition detector of the address supplier comprises the above described address transition detecting circuit.

Therefore, when an address signal with a very short pulse width is applied to a semiconductor storage unit of the present invention, information can be written/read according to an address transition detection signal with a predetermined pulse width.

Furthermore, in a semiconductor of the present invention, a resistor of an address transition detector is formed of the same material the gates of a p-channel type field effect transistor and an n-channel type field effect transistor in a complementary transistor circuit.

Therefore, a delay process can be performed accurately regardless of irregular processes of each complementary transistor circuit, thus reducing the destruction of data in a storage unit attributed to an ATD signal of a short pulse detected in the prior art technology.

Thus, the address transition detection can be performed stably; the reliability (sensitivity) of the address transition detecting circuit can be improved; data can be written/read at a high speed; and the power consumption can be minimized.

What is claimed is:

1. A semiconductor unit comprising:
   a first address extending circuit for delaying a non-inverted address signal of one of a plurality of addresses used in designating an information storage address, and for outputting a non-inverted delay address signal;
   a second address extending circuit for delaying an inverter address signal of said address and for outputting an inverted delay address signal; and
   a signal generating circuit for outputting an address transition detection signal indicating a change of an address value, said signal generating circuit including
      a first switch group for outputting a first logical level by being turned on when said non-inverted address signal and said inverted delay address signal are active; and
      a second switch group for outputting said first logical level by being turned on when said inverted address signal and said non-inverted delay address signal are active.

2. The semiconductor unit according to claim 1, wherein said signal generating circuit further includes
   a third switch group for outputting a second logical level by being turned on when said non-inverted address signal and said non-inverted delay address signal are inactive, and
   a fourth switch group for outputting said second logical level by being turned on when said inverted address signal and said inverted delay address signal are inactive.

3. The semiconductor unit according to claim 2, wherein
   each of said first and second address extending circuits comprises:
      multiple-step complementary transistor circuit having a p-channel type field effect transistor and an n-channel type field effect transistor;
      a capacitor connected to an output part of said complementary transistor circuit; and
      a resistor serially connected between said p-channel type field effect transistor and said n-channel type field effect transistor, wherein
      said resistor restricts electric current of either said p-channel type field effect transistor or said n-channel type field effect transistor to give different time constants for rise and fall points during turn on and during turn off respectively.

4. The semiconductor unit according to claim 3, wherein
   each of said capacitors forming said first address extending circuit and said second address extending circuit are connected to an output of said p-channel type field effect transistor in said respective complementary transistor circuit.

5. The semiconductor unit according to claim 3, wherein
   each of said capacitors forming said first address extending circuit and said second address extending circuit is connected to an output of said n-channel type field effect transistor in said respective complementary transistor circuit.

6. The semiconductor unit according to claim 3, wherein each of said first and second address extending circuits comprises two steps of complementary transistor circuits having an inversion logic, and
   said capacitor in each of said first and second address extending circuits is connected to an output part of said p-channel type field effect transistor forming said complementary transistor circuit in a first step, and to an output part of said n-channel type field effect transistor forming said complementary transistor circuit in a second step.

7. The semiconductor unit according to claim 3, wherein
   each of said first and second address extending circuits comprises two steps of complementary transistor circuits having an inversion logic, and
   said capacitor in each of said first and second address extending circuits is connected to an output part of said n-channel type field effect transistor forming said complementary transistor circuit in a first step, and to an output part of said p-channel type field effect transistor forming said complementary transistor circuit in a second step.

8. A semiconductor unit comprising:
   storage means for storing information;
   column selecting means for selecting a signal line in a column direction of said storage means;
   information outputting means for controlling write/read of said information;
   row selecting means for selecting a signal line in a row direction of said storage means;
   address input/output means for supplying said column selecting means and row selecting means with an address;
   first address extending circuit including
      more than one step complementary transistor circuit having a p-channel type field effect transistor and an n-channel type field effect transistor,
      a capacitor connected to an output part of said complementary transistor circuit,
      a resistor serially connected between said p-channel type field effect transistor and said n-channel type field effect transistor, wherein
      said resistor restricts electric current of either said p-channel type field effect transistor or said n-channel type field effect transistor to give different time constants for rise and fall points during turn on and during turn off respectively, and
      a non-inverted address signal of one of a plurality of address used in designating an information storage address is delayed to output a non-inverted delay address signal;
   a second address extending circuit including
      more than one step complementary transistor circuit having a p-channel type field effect transistor and an n-channel type field effect transistor,
      a capacitor connected to an output part of said complementary transistor circuit, and
      a resistor serially connected between said p-channel type field effect transistor and said n-channel type field effect transistor, wherein said resistor restricts electric current of either said p-channel type field effect transistor or said n-channel type field effect transistor to give different time constants for rise and fall points during turn on and during turn off respectively, and an inverted address signal of said plurality of addresses is delayed to output an inverted delay address signal;

an address transistor detecting circuit for outputting an address transistor detection signal indicating a change of an address value, said address transition detecting circuit including a first switch group for outputting a first logical level by being turned on when said non-inverted address signal and said inverted delay address signal are active, and a second switch group for outputting said first logical level by being turned on when said inverted address signal and said non-inverted delay address signal are active.

9. The semiconductor unit according to claim 8, wherein said address transition detecting circuit further comprising:

a third switch group for outputting a second logical level by being turned on when said non-inverted address signal and said non-inverted delay address signal are inactive, and a fourth switch group for outputting said second logical level by being turned on when said inverted address signal and said inverted delay address signal are inactive.

10. A semiconductor unit, comprising:

a first address extending circuit including more than one step complementary transistor circuit having a p-channel type field effect transistor and an n-channel type field effect transistor, a resistor serially connected between said p-channel type field effect transistor and said n-channel type field effect transistor, and a capacitor connected to an output part of said complementary transistor circuit, wherein said resistor restricts electric current of either said p-channel type field effect transistor or said n-channel type field effect transistor to give different time constants for rise and fall at a time of turn on and off respectively, and a non-inverted address signal of one of a plurality of addresses, used in designating an information storage address, is delayed to output a non-inverted delay address signal;

a second extending circuit including more than one step complementary transistor circuit having a p-channel type field effect transistor and an n-channel type field effect transistor, a resistor serially connected between said p-channel type field effect transistor and said n-channel type field effect transistor, and a capacitor connected to an output part of said complementary transistor circuit, wherein said resistor restricts electric current of either said p-channel type field effect transistor or said n-channel type field effect transistor to give different time constants for rise and fall points at a time of turn on and off respectively, and an inverted address signal of said plurality of addresses is delayed to output an inverted delay address signal; and a signal generating circuit for outputting an address transition detection signal indicating a change of an address value, said signal generating circuit including a first switch group for outputting a first logical level by being turned on when said non-inverted address signal and said inverted delay address signal are active, and a second switch group for outputting said first logical level by being turned on when said inverted address signal and said non-inverted delay address signal are active.

* * * * *